(12) United States Patent  
Huang et al.

(10) Patent No.: US 6,815,324 B2  
(45) Date of Patent: Nov. 9, 2004

(54) RELIABLE METAL BUMPS ON TOP OF I/O PADS AFTER REMOVAL OF TEST PROBE MARKS

(75) Inventors: Ching-Cheng Huang, Hsinchu (TW); Chuen-Jye Lin, Taichung (TW); Ming-Ta Lei, Hsinchu (TW); Mou-Shiung Lin, Hsinchu (TW)

(73) Assignee: MEGIC Corporation, Hsin-Chu (TW)

( * ) Notice: Subject to any disclaimer, the term of this patent is extended or adjusted under 35 U.S.C. 154(b) by 185 days.

(21) Appl. No.: 09/783,384

(22) Filed: Feb. 15, 2001

(65) Prior Publication Data

US 2002/0111009 A1 Aug. 15, 2002

(51) Int. Cl.$^7$ ............................................. H01L 21/44
(52) U.S. Cl. ..................... 438/612; 438/613; 438/614
(58) Field of Search .................. 438/611–615; 257/736–738; 437/183, 189

(56) References Cited

U.S. PATENT DOCUMENTS

| 5,137,845 A | * | 8/1992 | Lochon et al. ............... 437/183 |
| 5,554,940 A |   | 9/1996 | Hubacher ................... 324/765 |
| 5,756,370 A |   | 5/1998 | Farnworth et al. ............ 438/15 |
| 6,077,726 A | * | 6/2000 | Mistry et al. ................ 438/108 |
| 6,162,652 A | * | 12/2000 | Dass et al. ..................... 438/18 |
| 6,194,309 B1 | * | 2/2001 | Jin .............................. 438/639 |
| 6,197,613 B1 | * | 3/2001 | Kung et al. ................. 438/106 |
| 6,406,967 B1 | * | 6/2002 | Chung et al. ............... 438/381 |
| 6,426,556 B1 | * | 7/2002 | Lin |
| 2002/0086520 A1 | * | 7/2002 | Chiang ....................... 438/630 |

* cited by examiner

Primary Examiner—Hsien-Ming Lee  
(74) Attorney, Agent, or Firm—George O. Saile; Stephen B. Ackerman; Douglas R. Schnabel

(57) ABSTRACT

In accordance with the objectives of the invention a new method is provided for the creation of metal bumps over surfaces of I/O pads. Contact pads are provided over the surface of a layer of dielectric. The aluminum of the I/O pads, which have been used as I/O pads during wafer level semiconductor device testing, is completely or partially removed over a surface area that is smaller than the surface area of the contact pad using methods of metal dry etching or wet etching. The contact pad can be accessed either by interconnect metal created in a plane of the contact pad or by via that are provided through the layer of dielectric over which the contact pad has been deposited. The process can be further extended by the deposition, patterning and etching of a layer of polyimide over the layer of passivation that serves to protect the contact pad.

28 Claims, 19 Drawing Sheets

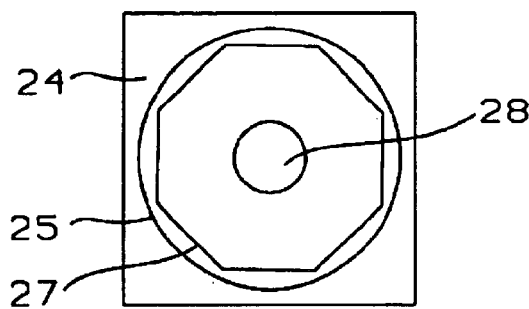
*FIG. 1a - Prior Art*
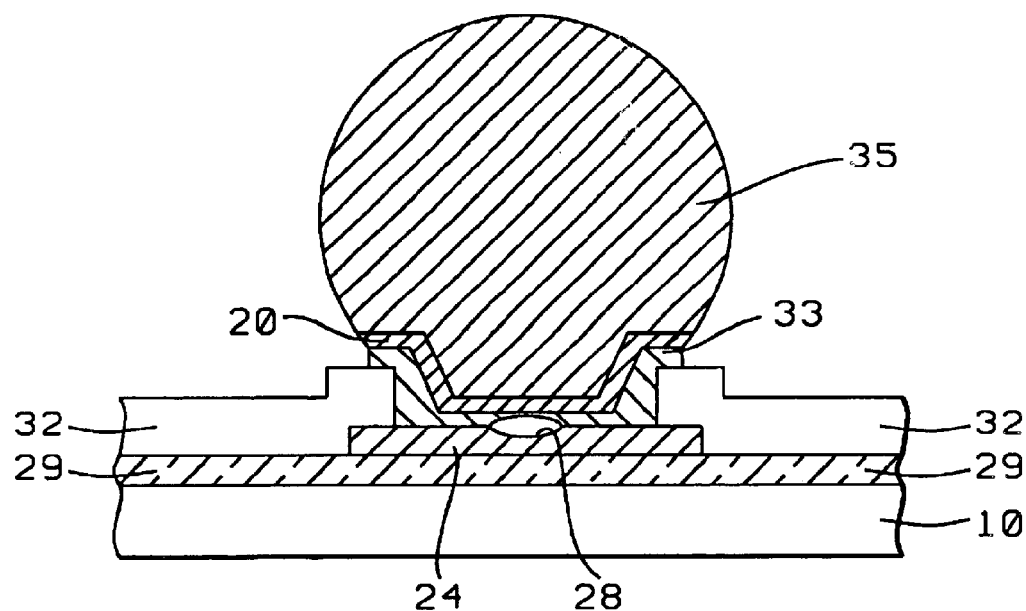
*FIG. 1b - Prior Art*

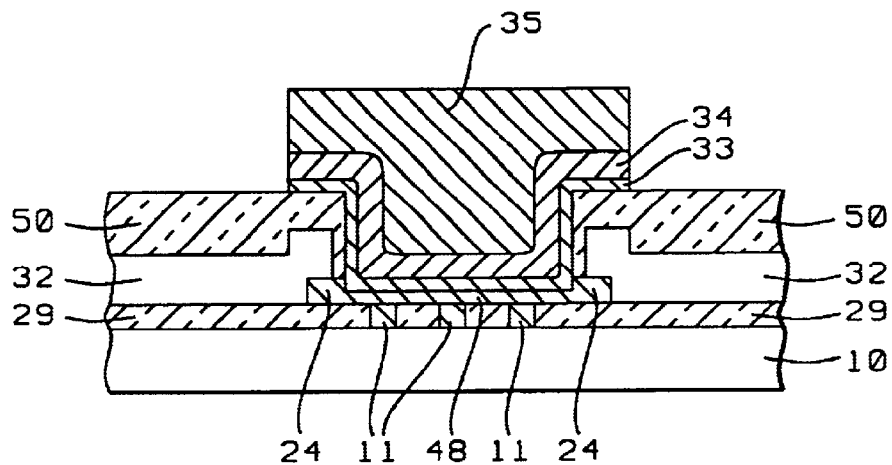
FIG. 18b
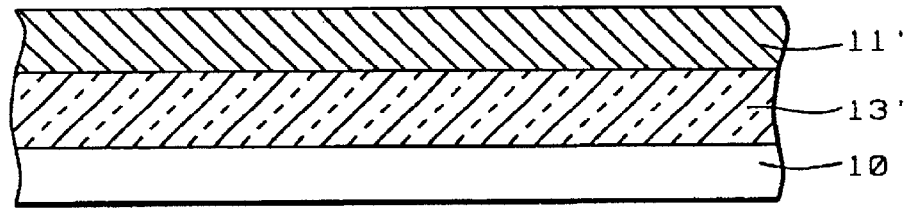
FIG. 19a – Prior Art
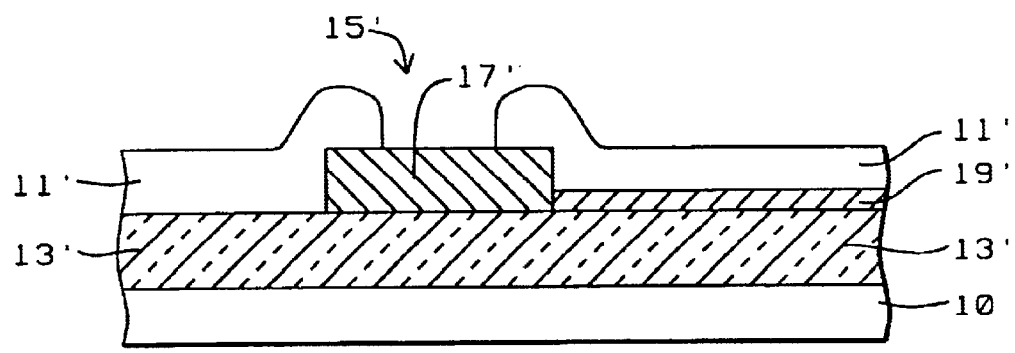
FIG. 19b – Prior Art

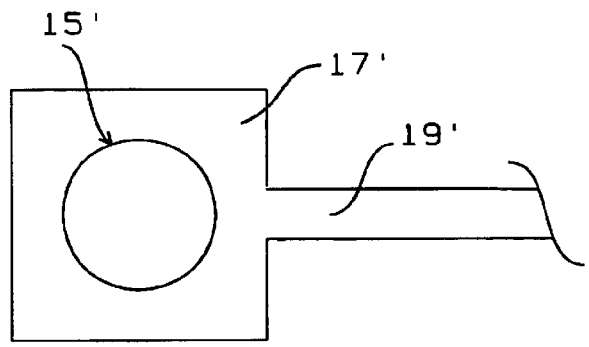
FIG. 19c — Prior Art
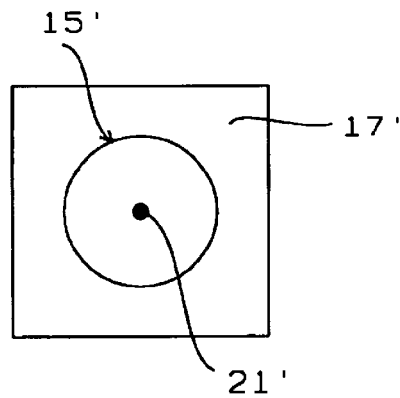
FIG. 20a — Prior Art
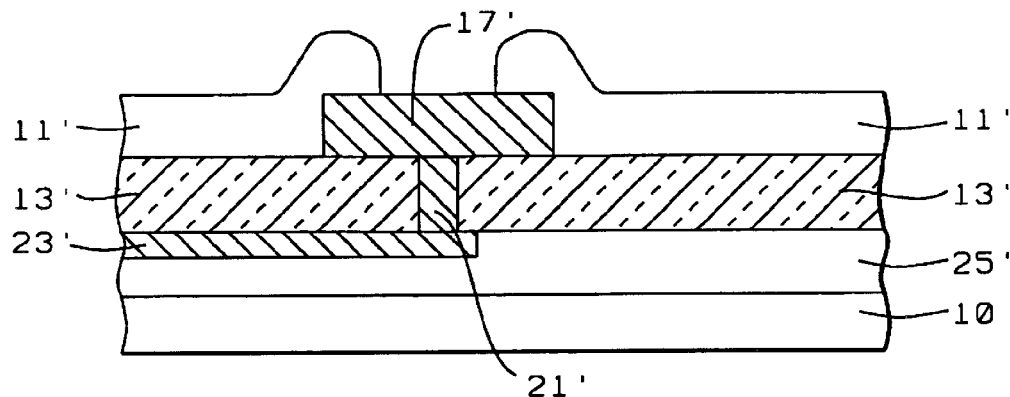
FIG. 20b — Prior Art

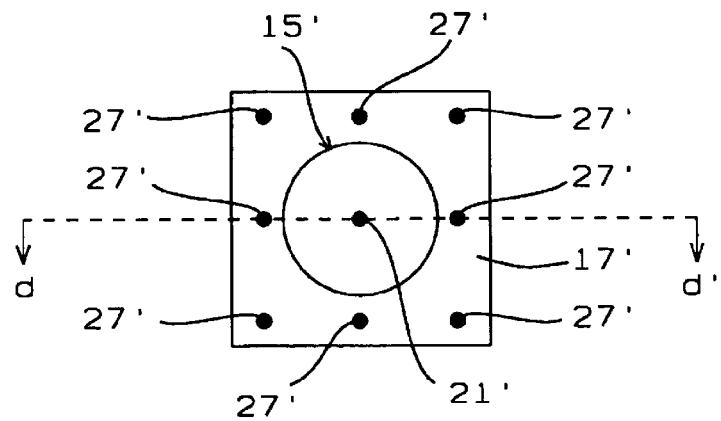
FIG. 20c — Prior Art
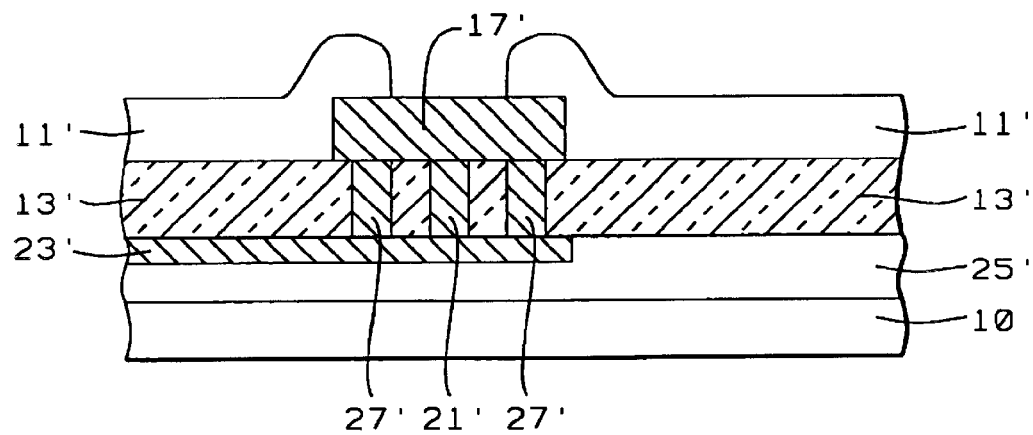
FIG. 20d — Prior Art

RELIABLE METAL BUMPS ON TOP OF I/O PADS AFTER REMOVAL OF TEST PROBE MARKS

This application is related to filed on Jan. 16, 2001, Ser. No. 09/760,909, now U.S. Pat. No. 6,426,556, assigned to a common assignee.

BACKGROUND OF THE INVENTION

(1) Field of the Invention

The invention relates to the fabrication of integrated circuit devices, and more particularly, to a method of removing damage to I/O pads that have been repetitively contacted and possibly damaged by test probes, thereby avoiding potential solder bump reliability problems.

(2) Description of the Prior Art

In creating semiconductor devices, the technology of interconnecting devices and device features is a continuing challenge in the era of sub-micron devices. Bond pads are frequently used for this purpose, whereby continuous effort is dedicated to creating bond pads that are simple, reliable and inexpensive.

Bond pads are generally used to wire device elements and to provide exposed contact regions of the die. These contact regions are suitable for wiring the die to components that are external to the die. An example is where a bond wire is attached to a bond pad of a semiconductor die at one end and to a portion of a Printed Circuit Board at the other end of the wire. The art is constantly striving to achieve improvements in the creation of bond pads that simplify the manufacturing process while enhancing bond pad reliability.

A frequently used bond pad consists of an exposed aluminum pad. A gold bond wire can be bonded to this aluminum pad. Materials that are typically used for bond pads include metallic materials, such as tungsten and aluminum, while heavily doped polysilicon can also be used for contacting material. The bond pad is formed on the top surface of the semiconductor device whereby the electrically conducting material is frequently embedded in an insulating layer of dielectric.

Contact pads, having dimensions of between about 40×40 $\mu$m and 120×120 $\mu$m, are in current practice frequently used as access or input/output contact points during wafer level testing of semiconductor devices. In view of the complexity and density of high performance semiconductor devices, these contact pads will, during a complete cycle of testing, be contacted a number of times. Testing is, as a matter of economic necessity, performed at high speed, which frequently results in landing the test probe on the surface of the contact pad at high speed, resulting in mechanical damage (in the form of probe marks) to the surface of the contact pad. Especially for memory products, a wafer is tested at least two times, that is before and after repair of faulty (weak or bad) memory lines. The distribution of the location of the probe mark over the surface of the contact pad is, in a well controlled testing production line, limited to a surface area of about 60×60 $\mu$m. Surface damage to the contact pad may occur in the form of a dent (in the surface of the contact pad) or may even become severe enough that the surface of the contact pad is disrupted, resulting in the occurrence of burring in the surface of the contact pad. After the contact pads have in this manner been used as an I/O point for accessing the semiconductor device during high speed testing, a number of these contact pads are frequently used for the creation of solder bumps or gold bumps over the surface thereof. In instances where the surface of the contact pad is damaged, it is clear that the surface of the contact pad forms a poor basis on which to create a solder bump or a gold bump. The invention addresses this concern and provides a method whereby surface damage to contact pads is removed.

U.S. Pat. No. 6,162,652 (Dass et al.) provides for the testing of an integrated circuit device including depositing a solder bump on a surface of a bond pad.

U.S. Pat. No. 5,756,370 (Farnworth et al.) provides a compliant contact system for making temporary connection with a semiconductor die for testing and a method for fabricating the pliable contact system.

U.S. Pat. No. 5,554,940 (Hubacker) addresses the probing of semiconductor devices that have been provided with contact bumps and the formation of peripheral test pads.

SUMMARY OF THE INVENTION

A principle objective of the invention is to eliminate the effect of surface damage to I/O pads that has been caused by using these I/O pads as contact points for wafer level testing of semiconductor devices.

Another objective of the invention is to eliminate the effect of probe marks on the surface of I/O pads for I/O pads that have been used as contact points for wafer level testing of semiconductor devices.

In accordance with the objectives of the invention a new method is provided for the creation of metal bumps over surfaces of I/O pads. Contact pads are provided over the surface of a layer of dielectric. The aluminum of the I/O pads, which have been used as I/O pads during wafer level semiconductor device testing, is completely or partially removed over a surface area that is equal to or smaller than the surface area of the contact pad using methods of metal dry etching or wet etching. The contact pad can be accessed either by interconnect metal created in a plane of the contact pad or by vias that are provided through the layer of dielectric over which the contact pad has been deposited. The process can be further extended by the deposition, patterning and etching of a layer of polyimide over the layer of passivation that serves to protect the contact pad.

BRIEF DESCRIPTION OF THE DRAWINGS

FIGS. 1a and 1b show a top view and a cross section of a prior art metal bump that is created over the surface of an aluminum pad that has been used as an I/O contact pad during wafer level device testing.

FIGS. 6 through 13b address the processing steps of the invention whereby no layer of polyimide is used, as follows:

FIG. 6 shows a cross section of a semiconductor surface, a layer of dielectric has been deposited over the semiconductor surface, a contact pad has been provided over a layer of dielectric. A layer of passivation has been deposited, patterned and etched, creating in opening in the layer of passivation that aligns with the contact pad. A probe mark is highlighted.

FIG. 7 shows a cross section after the contact pad has been partially etched using the layer of passivation as a self-aligned etching mask. The contact pad is contacted by means of interconnect metal (not shown) that has been created in the plane of the contact pad, the interconnect metal is not part of the invention.

FIG. 8 shows a cross section after the contact pad has been partially etched using the layer of passivation as a self-aligned etching mask. The contact pad is contacted by means of an array of vias created in the underlying layer of dielectric, this array of vias is not part of the process of the invention.

FIG. 12a shows a cross section after a layer of bump metal has been deposited over the layer of enhanced UBM of the structure of FIG. 11a.

FIG. 13a shows a cross section after photoresist stripping and etching of the layer of UBM of the structure of FIG. 12a.

FIG. 13b shows a cross section after photoresist stripping and etching of the layer of UBM of the structure of FIG. 12b.

FIGS. 14a through 18b address the processing steps of the invention whereby a layer of polyimide is used, as follows:

FIG. 14a can be compared with FIG. 7, a layer of polyimide has been added and patterned to the cross section that is shown in FIG. 14a. The contact pad is then either partially or completely etched in accordance with the opening created in the layer of polyimide.

FIG. 15a can be compared with FIG. 10a, a patterned layer of polyimide has been added to the cross section that is shown in FIG. 15a.

FIG. 16a can be compared with FIG. 11a, a patterned layer of polyimide has been added to the cross section that is shown in FIG. 16a.

FIG. 17a can be compared with FIG. 12a, a patterned layer of polyimide has been added to the cross section that is shown in FIG. 17a.

FIG. 18a can be compared with FIG. 13a, a patterned layer of polyimide has been added to the cross section that is shown in FIG. 18a.

FIG. 18b can be compared with FIG. 13b, a patterned layer of polyimide has been added to the cross section that is shown in FIG. 18b.

FIGS. 19a through 19c show prior art methods of creating a contact pad, the contact pad is contacted by means of interconnect metal that is created in the plane of the contact pad.

FIGS. 20a through 20d show prior art methods of creating a contact pad, the contact pad is contacted by means of vias that penetrate the layer of dielectric over which the contact pad is deposited.

DESCRIPTION OF THE PREFERRED EMBODIMENTS

Figure 2A:
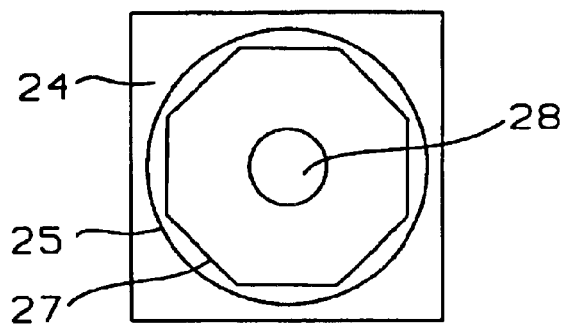
FIGS. 2a through 2d show a top view and a cross section of the implementation of the first embodiment of the invention, that is the contact pad is completely or partially etched within the opening that has been created in the protective layer of passivation. The contact pad is contacted by means of interconnect metal (not shown) that has been created in the plane of the contact pad, the interconnect metal is not part of the invention.

Contact pads, having dimensions of about between about 60×60 $\mu$m and 120×120 $\mu$m, are in current practice frequently used as access or input/output contact points during wafer level testing of semiconductor devices. In view of the complexity and density of high performance semiconductor devices, these contact pads will, during a complete cycle of testing, be contacted a number of times. Testing is as a matter of economic necessity performed at high speed, which frequently results in landing the test probe on the surface of the contact pad at high speed, resulting in mechanical damage to the surface of the contact pad. In a well controlled testing production line, the distribution of the probe marks (or the damaged surface area of the contact pad) is limited (controlled) to an area in the range of about 60×60 μm. Damage to the contact pad surface may occur in the form of a dent or may even become severe enough that the surface of the contact pad is broken, resulting in burring of the surface of the contact pad. After the contact pads have been used as I/O points during high speed testing, a number of these contact pads are frequently used for the creation of solder or gold bumps over the surface thereof. In instances where the surface of the contact pad is damaged, it is clear that this surface forms a poor basis over which to create a solder bump or a gold bump. The invention addresses this concern and provides a method whereby surface damage to contact pads is removed.

For memory products, such as SRAM devices, probe testing which uses bond pads for accessing the devices, must be performed prior to creating wafer solder bumps on the surface of the bond pads, this in order to allow for memory repairs of faulty devices. The most recent practice is for the repair of memory products to be performed by opening (breaking or interrupting) polysilicon fuses using lasers. As indicated above, the testing can cause damage to the surface of the bond pads, creating problems of solder bump and device reliability.

This is further highlighted in FIGS. 1a and 1b. FIG. 1a shows a top view of a metal bump structure that is created using current practices. FIG. 1b shows a cross section of the metal bump structure using current practices. It is assumed that the views that are shown in FIGS. 1a and 1b relate to an aluminum contact pad that has been used as a point of I/O for testing of a device at the wafer level, using a tester probe to contact the aluminum pad.

Shown in FIG. 1a is a top view of a prior art metal bump having the following elements:

24, an aluminum contact pad
25, the circumference of a metal bump overlying aluminum contact pad 24
27, the circumference of the opening created in the protective layer 32 of passivation (see FIG. 1b)
28, a probe mark caused by a tester probe (not shown) in the surface of aluminum contact pad 24.

Shown in FIG. 1b is a cross section of a prior art metal bump having the following elements:

10, the silicon substrate over which the aluminum contact pad has been created
24, an aluminum contact pad
28, the probe mark or bump that has been created in the surface of the aluminum contact pad 24 by the tester probe (not shown)
29, a layer of dielectric that has been deposited over the surface of substrate 10;
32, a layer of passivation that has been deposited over the surface of the layer 29 of dielectric; an opening (with a circumference 27, as shown in FIG. 1a) has been created in the layer 32 of passivation
33, a layer of under-bump-metal (UBM) overlying the aluminum pad 24
20, a layer of metal, such as copper or nickel, that forms an integral part of the pedestal of the metal bump
35, the metal bump created overlying the aluminum contact pad 24.

From the above it must be understood that, after the testing has been completed, the layer 33 of under bump metal is created overlying the aluminum contact pad 24. The surface of aluminum contact pad 24 is not planar (as shown with the probe mark 28 in FIG. 1b) and is in many instances disturbed in an unpredictable manner by the tester probe. The layer 33 of under bump metal does therefore in most cases not fill the damaged surface region 28 of the aluminum pad 24. This opens the potential for trapping foreign and undesirable materials, such as moisture, a processing gas, a plating solution, solvent and the like, in the unfilled (by the layer 33 of under bump metal) regions in or surrounding the probe mark 28 on the surface of the aluminum pad 24.

The invention addresses the above detailed problems that are encountered in contact pads by providing the following solutions:

1) a contact pad of standard design, etching the contact pad and completely or partially removing the aluminum of the contact pad over a surface area of the contact pad that is bounded by the opening that is created in the overlying protective layer of passivation; the metal bump is created filling and overlying the opening that has been created in the layer of passivation. The contact pad is contacted by means of interconnect metal that is created in the plane of the contact pad, this interconnect metal is not part of the invention 2) as highlighted under 1) above, in this case the contact pad is contacted by means of one or more vias that are created penetrating the layer of dielectric over the which the contact pad has been deposited 3) the design as indicated above under 1) whereby an extra layer of polyimide has been added to the design of the contact bump; the opening that is created in the layer of polyimide replaces the previously used opening in the layer of passivation in providing the boundaries for etching the contact pad. This layer of polyimide is extremely important especially for memory products in applications where fuse repair is required. The polyimide covers and protects fuses during subsequent etching processes, such as for instance contact pad etching 4) the design as indicated above under 2) whereby an extra layer of polyimide has been added to the design of the contact bump; the opening that is created in the layer of polyimide replaces the previously used opening in the layer of passivation in providing the boundaries for etching the contact pad. The layer of polyimide can similarly cover and protect fuses during etching in subsequent processing steps.

These four highlighted approaches are further shown in FIGS. 2a through 5d.

Figure 2B:
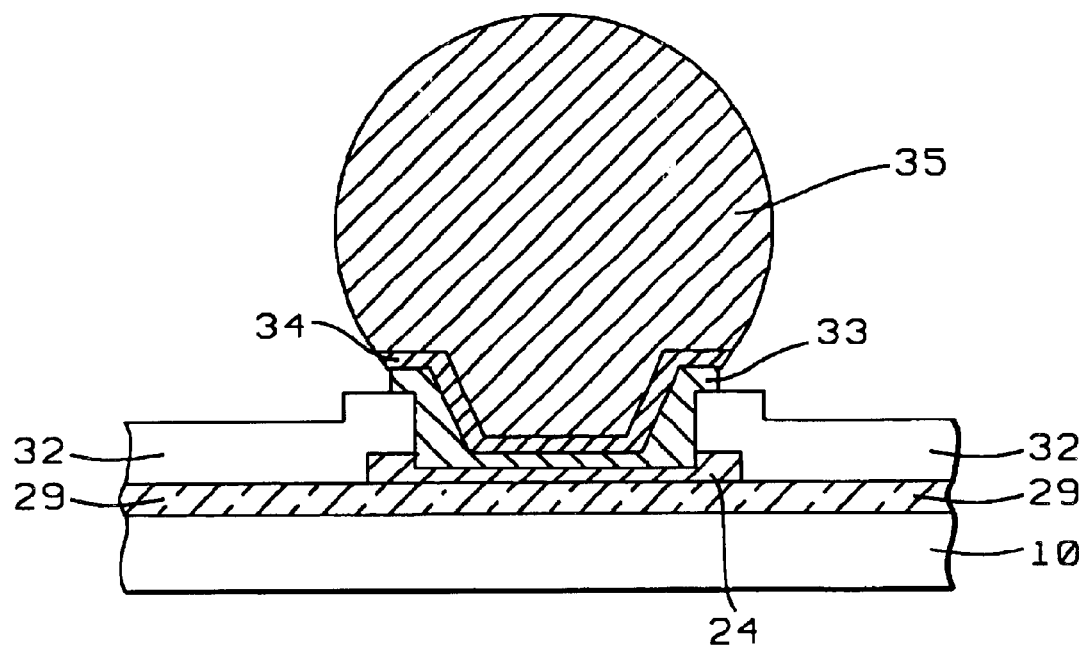

FIG. 2a shows a top view of the metal bump of the invention that applies to the first embodiment of the invention. The contact pad 24 is contacted by means of interconnect metal (not shown) that is created in the plane of the contact pad and overlying the surface of layer 29 of dielectric. Shown in FIG. 2a are:

24, an aluminum contact pad
25, the circumference of a metal bump created overlying aluminum contact pad 24
27, the circumference of the opening that is created in an overlying protective layer 32 of passivation, see FIG. 2b
28, the region in the surface of the aluminum contact pad 24 where a probe mark has been left by the tester probe.

It must be noted that the region that is bordered by circumference 27, FIG. 2a, is the region of the contact pad 24 that is exposed and surrounded by the layer 32 of passivation (FIG. 2b). This surface region is therefore the exposed surface of the contact pad 24 at the time prior to the creation of Under Bump Metal over the surface of the contact pad 24.

Shown in FIG. 2b are:

10, the silicon substrate over which the aluminum contact pad has been created 24, an aluminum contact pad 29, a layer of dielectric deposited over the surface of substrate 10;

32, a layer of passivation deposited over the surface of the layer 29 of dielectric; an opening has been created in the layer 32 of passivation 33, a layer of under-bump-metal (UBM) overlying the aluminum pad 24

34, a layer of enhanced UBM that forms an integral part of the pedestal of the metal bump; layer 34 serves to enhance adhesion between overlying layers, as a diffusion barrier and to form one of the plates during the process of electroplating 35, the metal bump created overlying the aluminum contact pad 24.

It must be understood that the layer 32 of passivation that is deposited over the surface of said semiconductor surface can comprise a plurality of layers of passivation material.

Figure 2C:
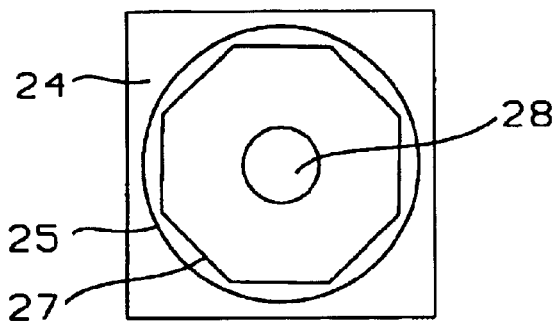
Figure 2D:
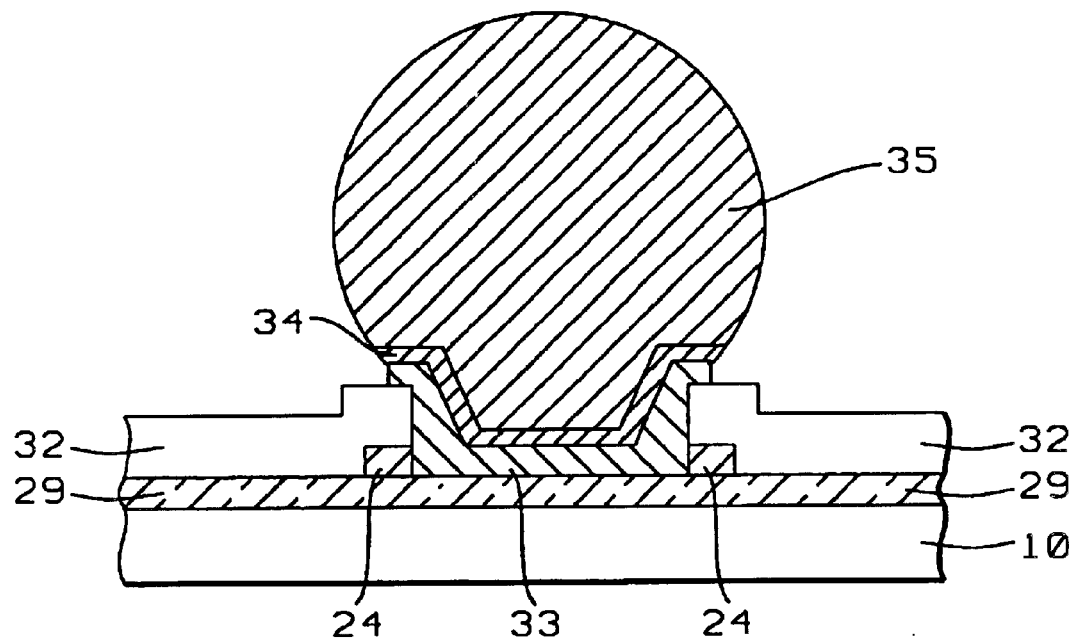

Notable in the cross section that is shown in FIG. 2b is that the thickness of the contact pad 24 has been reduced by a considerable amount over a surface region of the contact pad 24 that is bordered by circumference 27 (FIG. 2a) of the layer 32 of passivation. As shown in the cross section of FIG. 2b, the contact pad has been reduced to a thickness of about 2000 Angstrom. As one of the solutions to the problem of the probe bump in the surface of the contact pad, the contact pad can also be completely removed within the opening of the layer 32 of passivation, down to the surface of the layer 29 of dielectric. This latter solution has been highlighted in the cross sections that are shown in FIGS. 2c and 2d where the contact pad has been etched down to the surface of the layer 29 of dielectric.

Figure 3A:
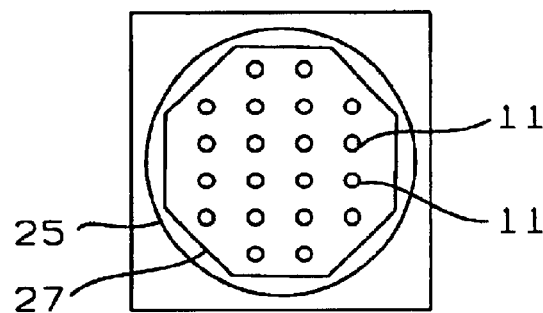
FIGS. 3a through 3d show a top view and a cross section of the implementation of the second embodiment of the invention, that is the contact pad is completely or partially etched. The contact pad is contacted by means of an array of vias created in the underlying layer of dielectric, this array of vias is not part of the process of the invention.
Figure 3B:
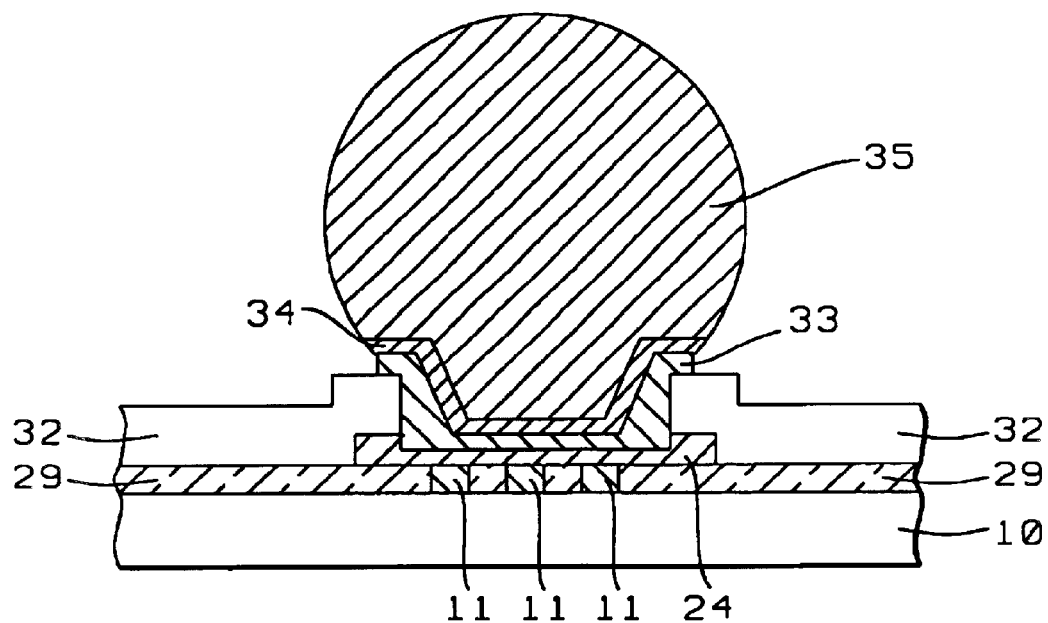
Figure 3C:
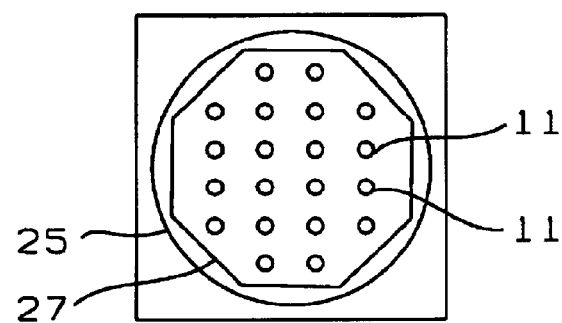
Figure 3D:
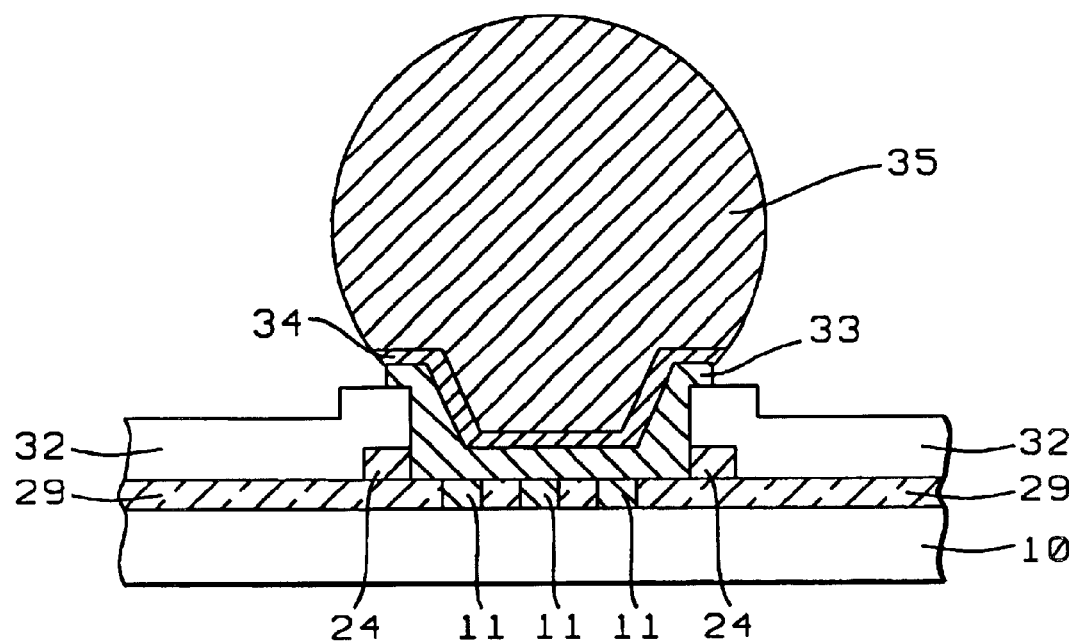

FIGS. 3a through 3d show the solution of the invention whereby the contact pad 24 is contacted by means of an array of vias 11 created in the underlying layer 29 of dielectric. The creation of vias 11 is not part of the invention. As in the solution that is shown in FIGS. 2a through 2d, the contact pad can be reduced to a thickness of about 2000 Angstrom (FIG. 3b) or the contact pad can be etched down to the surface of the underlying layer 29 of dielectric (FIG. 3d).

Figure 4A:
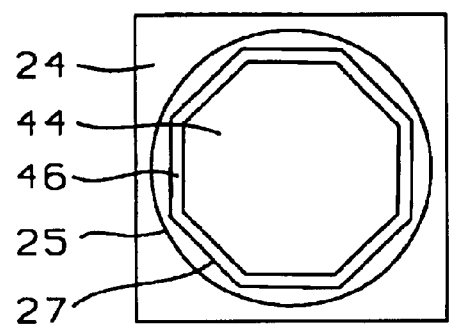
FIGS. 4a through 4d show a top view and a cross section of the implementation of the third embodiment of the invention. A layer of polyimide has been added to the structure, the contact pad is completely or partially etched within the opening that has been created in the layer of polyimide. The contact pad is contacted by means of interconnect metal (not shown) that has been created in the plane of the contact pad, the interconnect metal is not part of the invention.
Figure 4B:
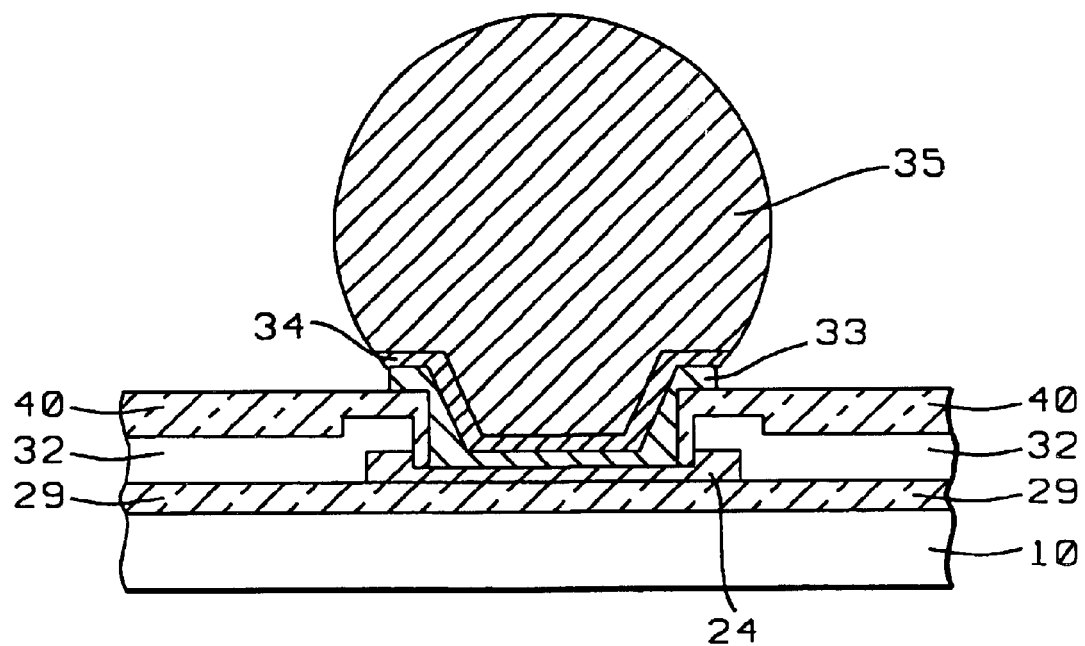
Figure 4C:
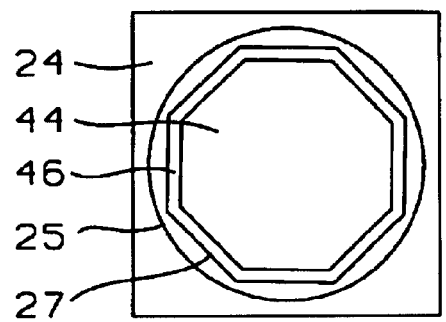
Figure 4D:
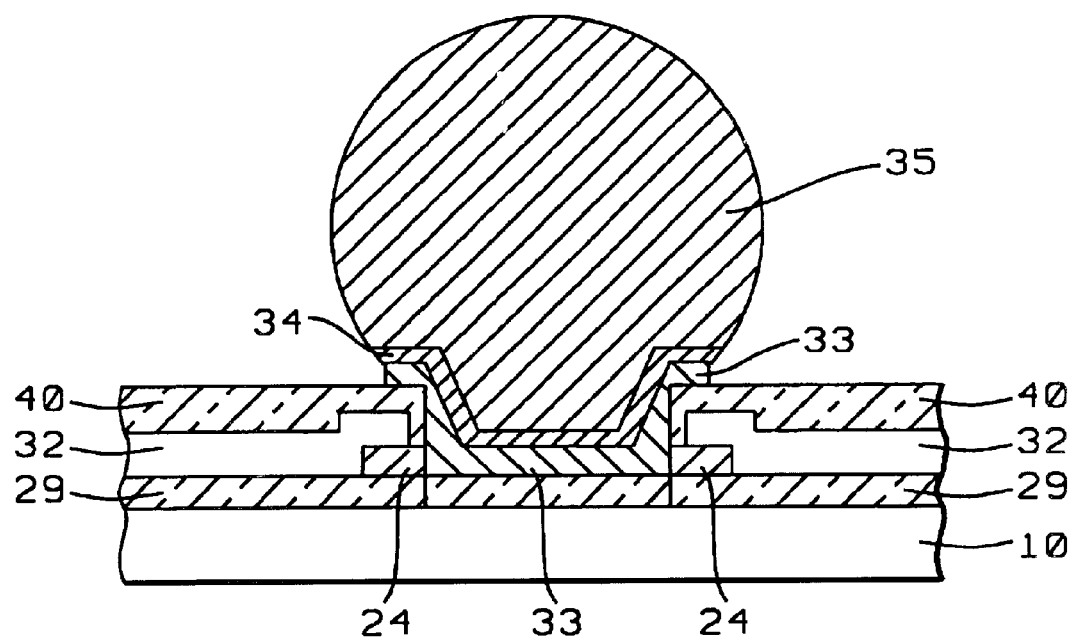

FIG. 4a shows a top view of the metal bump that is essentially the same as the cross section that is shown in FIG. 2a with the addition of the line 46 which is the circumference of the opening that has been created in a layer 40 (see FIG. 4b) of polyimide that has been added to the structure. FIGS. 4a through 4d address the case where the contact pad 24 is contacted by means of interconnect metal (not shown) that is created in the plane of the contact pad and overlying layer 29 of dielectric. Layer 40 of polyimide is better visible in the cross section that is shown in FIG. 4b. FIG. 4b shows a cross section that is essentially the same as the cross section that is shown in FIG. 2b with the addition of a layer 40 of polyimide. The surface of contact pad 24 is exposed (surface area 44 of FIGS. 4a and 4b) within the boundaries of the line 46, this prior to the creation of UBM layers overlying the contact pad 24. The aluminum of the contact pad 24 can be etched, as limited by the opening 46 that has been created in the layer 40 of polyimide. The etch can either completely remove the aluminum of the contact pad 24 from above the surface of layer 29 of dielectric (FIG. 4d) or can reduce that thickness of the contact pad 24 to where about 2000 Angstrom of aluminum remains in place on the surface of layer 29 of dielectric (FIG. 4b).

Figure 5A:
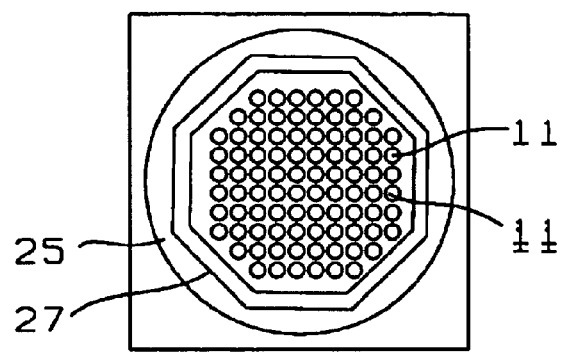
FIGS. 5a through 5d show a top view and a cross section of the implementation of the fourth embodiment of the invention. A layer of polyimide has been added to the structure, the contact pad is completely or partially etched. The contact pad is contacted by means of an array of vias created in the underlying layer of dielectric, this array of vias is not part of the process of the invention.
Figure 5B:
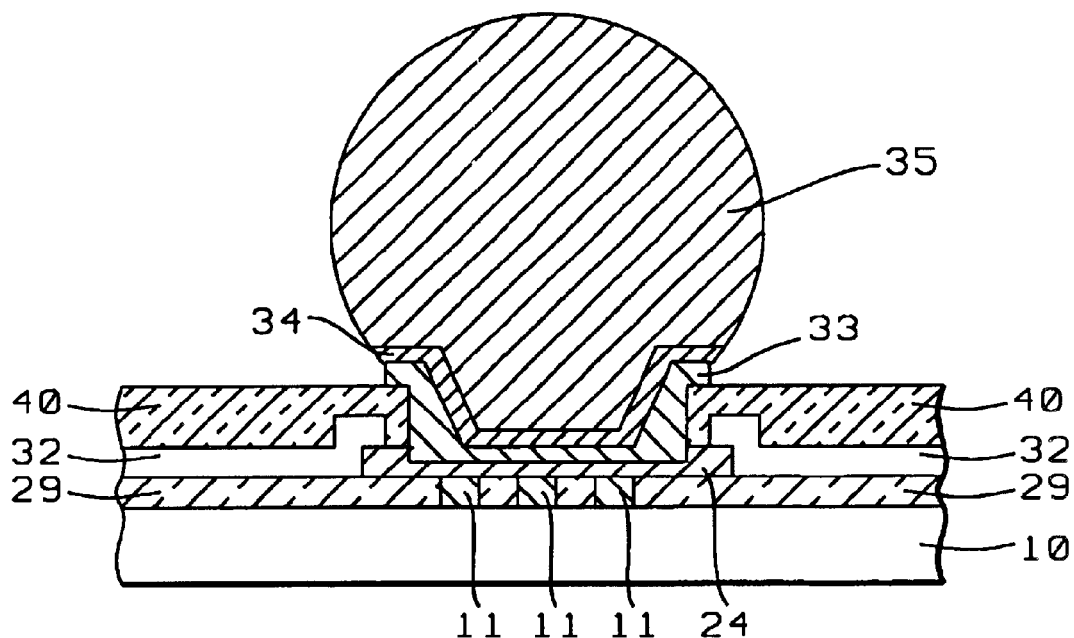
Figure 5C:
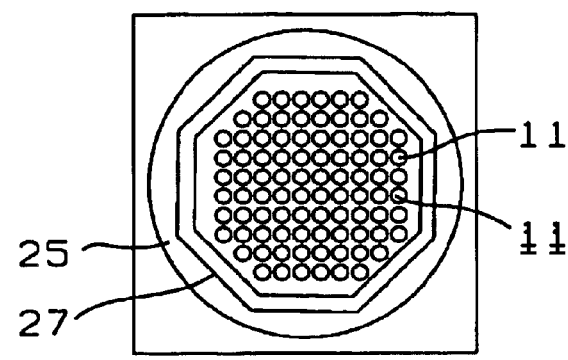
Figure 5D:
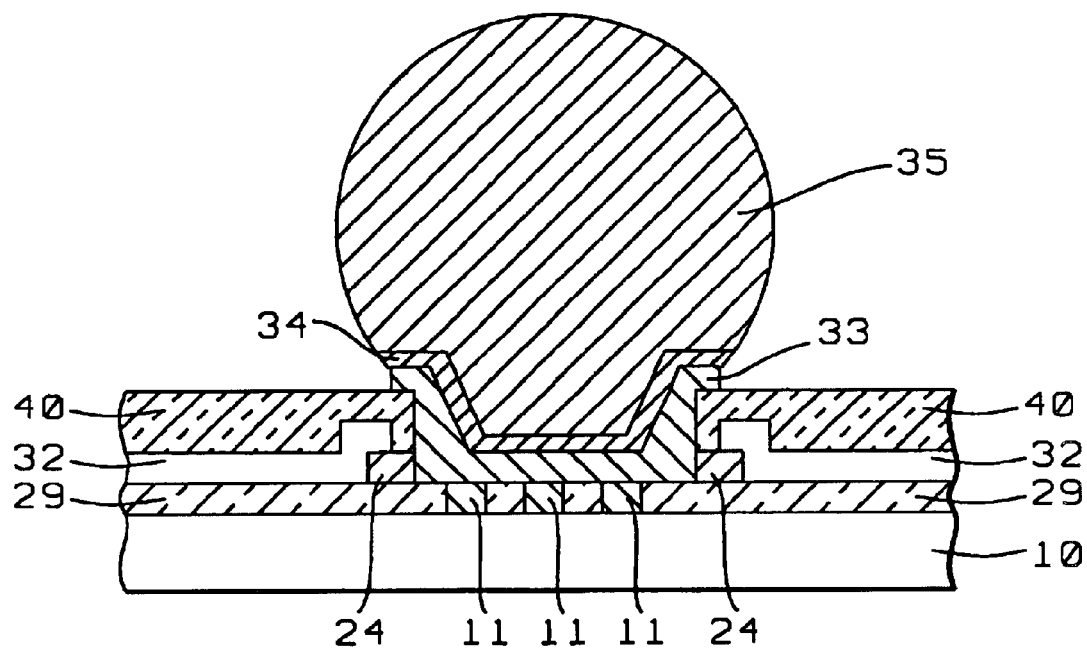

As FIGS. 4a through 4d have been related to FIGS. 2a through 4b, so can FIGS. 5a through 5d can be related to FIGS. 3a through 3d. FIG. 5a shows a top view of the metal bump of the invention that is essentially the same as the top view that is shown in FIG. 3a with the addition of the line 46 which is the circumference of the opening in a layer 40 of polyimide that has been added to the structure. FIGS. 5a through 5d address the case where the contact pad 24 is contacted by means of vias 11 that have been created penetrating the underlying layer 29 of dielectric. The creation of vias 11 is not part of the invention. This layer 40 of polyimide is again better visible in the cross section that is shown in FIG. 5b. FIG. 5b shows a cross section that is essentially the same as the cross section that is shown in FIG. 3b with the addition of a layer 40 of polyimide. The surface of contact pad 24 is visible (exposed) as bounded by the line 46, this prior to the creation of UBM layers overlying the contact pad 24. The aluminum of the contact pad 24 can be etched, limited by the opening 46 that has been created in the layer 40 of polyimide. The etch can either completely remove the aluminum of the contact pad 24 from above the surface of layer 29 of dielectric or can reduce that thickness of the contact pad 24 to where about 2000 Angstrom of aluminum remains in place on the surface of layer 29 of dielectric.

It must be noted that the use of polyimide films as inter-level dielectrics has been pursued as a technique for providing partial planarization of a dielectric surface. For memory products, the polyimide covers and protects the fuses, which are used for memory repair, during aluminum etching or during UBM etching in the process of the invention. Polyimides offer the following characteristics for such applications:

they produce surfaces in which the step heights of underlying features are reduced, and step slopes are gentle and smooth.

they are available to fill small openings without producing the voids that occur when low-temperature CVD oxide films are deposited.

the cured polyimide films can tolerate temperatures of up to 500 degrees C. without degradation of their dielectric film characteristics.

polyimide films have dielectric breakdowns, which are only slightly lower than that of $SiO_2$.

the dielectric constant of polyimides is smaller than that of silicon nitride and of $SiO_2$.

the process used to deposit and pattern polyimide films is relatively simple.

To summarize the invention:

an aluminum contact pad is provided over the surface of a layer of dielectric, the layer of dielectric has been deposited on a semiconductor surface, typically the surface of a semiconductor substrate; the creation of the contact pad is not part of the invention the surface of the aluminum pad is partially exposed, prior to formation of overlying layers of UBM and bump metal, either through an opening that is created in a layer of passivation that has been deposited over the layer of dielectric or through an opening that has been created in a layer of polyimide that has been deposited over the surface of a layer of passivation the partially exposed surface of the aluminum pad is etched, either completely or partially removing the aluminum from above the surface of the layer of dielectric the contact pad can be contacted either by means of interconnect metal (not part of the invention) that is created in the plane of the contact pad and overlying the layer of dielectric above which the contact pad is located or by means of vias (not part of the invention) that are created through the layer of dielectric above which the contact pad is located.

Prior art methods that are used to create a contact pad are further highlighted in FIGS. 19a and 19b and in FIGS. 20a through 20d. These figures also address methods that can be used for the interconnection of the contact pad. Although these methods of interconnection of contact pads are not part of the invention, a brief review of these methods at this time is considered of value.

FIGS. 19a through 19c address the conventional processing sequence that is used to create an aluminum bond pad.

The process starts with a semiconductor surface 10, FIG. 19a, typically the surface of a silicon single crystalline substrate. An interconnection scheme 13' consisting of one or more layers of metal and Intra Metal Dielectric (IMD) is created over the surface 10. A layer 17' of metal, typically aluminum, is deposited over the surface of the layer 13'. Layer 17' of aluminum is patterned and etched, typically using a layer of photoresist (not shown in FIG. 19a) and conventional methods of photolithography and etching. After the bond pad 17', FIG. 19b, has been created in this manner, and after interconnect 19' has been created, a layer 11' of passivation is deposited over the layer 13'. An opening 15' that aligns with the bond pad 17' is created in the layer 11' of passivation, again using methods of photolithography and etching. Shown in cross section in FIG. 19b is element 19', which represents one method of connecting the contact pad 17' to surrounding circuit elements. FIG. 19c shows a top view of the contact pad 17', the top view of the contact pad 17' that is shown in FIG. 19c shows interconnection 19' (to other electrical components) and the opening 15' that is created in the layer 11' of passivation. The contact pad that is shown in FIGS. 19a through 19c is accessed by means of interconnect metal (19') which is created in the plane of the contact pad 17'.

Another approach that is used to access a contact pad is shown in FIGS. 20a through 20d. Using this approach, the contact pad 17' is accessed by means of vias that are in contact with the contact pad. FIG. 20a shows a top view of a contact pad 17' that is exposed through opening 15' in a layer of surrounding passivation. Also shown in FIG. 20a is via 21' that in this case has been created in about the center of opening 15'. Via 21' is more clearly shown in the cross section of FIG. 20b where also is shown interconnect line 23' that now can be used to connect the contact pad 17' to additional electrical components or interconnect networks. Interconnect line 23' is in most instances imbedded in a layer 25' of dielectric that overlies a semiconductor surface 10. This method of "vertical" interconnect need not be limited to one interconnect via 21' but can be extended to include a number of vias, this is shown in top view in FIG. 20c and in cross section in FIG. 20d. The cross section that is shown in FIG. 20d is taken along the line d–d' of FIG. 20c and shows three of the vias (one via 21' and two vias 27') that have been shown in top view in FIG. 20c. Interconnect line 23' in this case is used to establish electrical contact between the contact pad 17' and surrounding electrical components (not shown). For most present day applications, tungsten is the preferred metal that is used for the creation of metal vias 21' and 27', the contact pad 17' is preferably made using aluminum.

The above has been highlighted in some depth in order to establish that the invention starts after a contact has been created. This contact pad may be accessed in any of the methods that been highlighted above, any processing that is provided by the invention therefore does not concern itself with the creation of vias to which the contact pad is connected or with the creation of interconnect metal in the plane of the contact pad.

Processing steps that are required to implement the invention are described next. FIGS. 6 through 13b follow the processing sequence that is required to create a metal bump in accordance with the top view and cross section that is shown in FIGS. 2a through 3d, that is no layer of polyimide is used for these processing steps.

Figure 6:
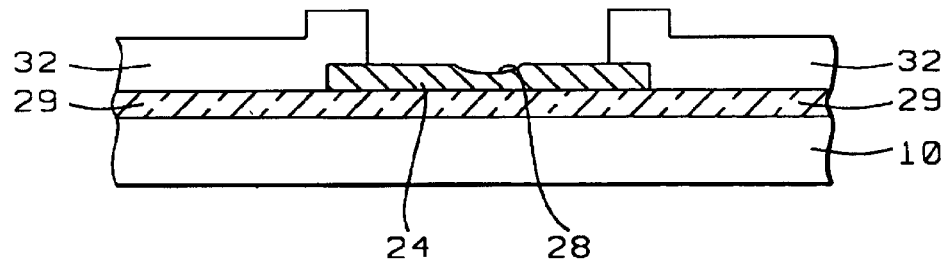

FIG. 6 shows a cross section of substrate 10 on the surface of which a contact pad has been created, the following elements are highlighted:

10, a silicon substrate over the surface of which an aluminum contact pad has been created 24, the aluminum contact pad 28, the probe mark or bump that has been created in surface of the aluminum contact pad 24 by repetitive contacting of the contact pad 24 by a tester probe (not shown)

29, a layer of dielectric that has been deposited over the surface of substrate 10

32, a layer of passivation that has been deposited over the surface of the layer 29 of dielectric. An opening has been created in the layer 32 of passivation that aligns with the aluminum contact pad 24, partially exposing the surface of the contact pad 24.

Figure 7:
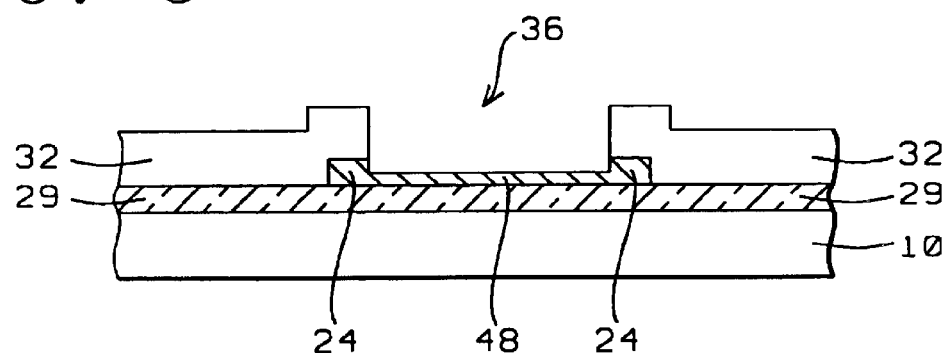
Figure 9A:
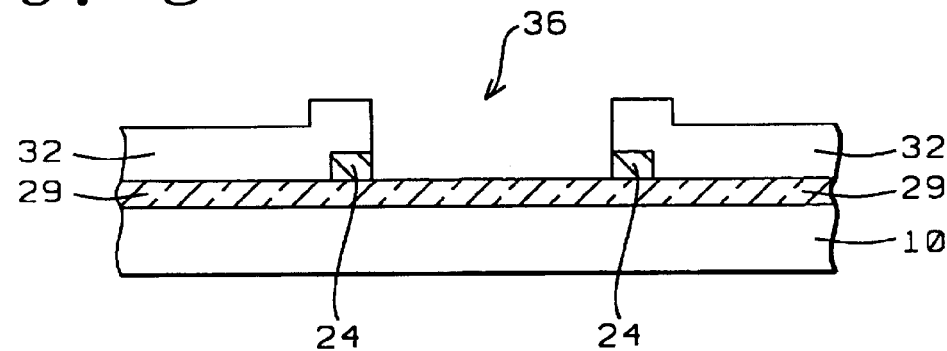
FIG. 9a shows a cross section after the contact pad has been completely etched using the layer of passivation as a self-aligned etching mask. The contact pad is contacted by means of interconnect metal (not shown) that has been created in the plane of the contact pad, the interconnect metal is not part of the invention.

FIG. 7 shows a cross section of the substrate 10 after the aluminum contact pad 24 has partially etched in accordance with the opening 36 of the passivation 32. This etch of the aluminum pad has created opening 36 in the aluminum pad 24 and has, as is the objective of the invention, removed the probe mark 28 and the regions surrounding the probe mark 28 from the surface of the aluminum pad 24. The depth of the etch of the aluminum pad 24 can be controlled by controlling the etch time. This implies that not all of the aluminum of contact pad 24 has to be removed from the surface of layer 29 of dielectric. As one of the preferred methods of the invention that is shown in FIG. 7, a layer of aluminum with a thickness of about 2000 Angstrom is left in place over the surface of the layer 29 of dielectric, bounded by the opening 36 of passivation 32. From this it is clear that, where FIG. 7 shows a layer 48 with a thickness of about 2000 Angstrom, this layer of aluminum may be further removed from the surface of layer 29 of dielectric by continued etching of the contact pad 24, as shown in FIG. 9a. It is of interest to note that contact pad 24 remains fully in place where the layer 32 of passivation overlies the contact pad 24.

The etching of the aluminum pad 24 in accordance with opening 36 can, as previously stated, use methods of plasma enhanced dry etching or wet etching with a $H_3PO_4$ solution. Other methods for the etching of the aluminum pad have previously been highlighted and equally apply at this stage in the process.

In order to obtain improved processing results and adhesion of UBM metal to the remaining aluminum contact pad 24 and to the exposed surface of IMD layer 29, it is of value to perform an in-situ sputter clean of the exposed surfaces of the aluminum contact pad 24 and the layer 29 of IMD. This in-situ sputter clean is most beneficially performed before a layer of UBM is created.

Figure 8:
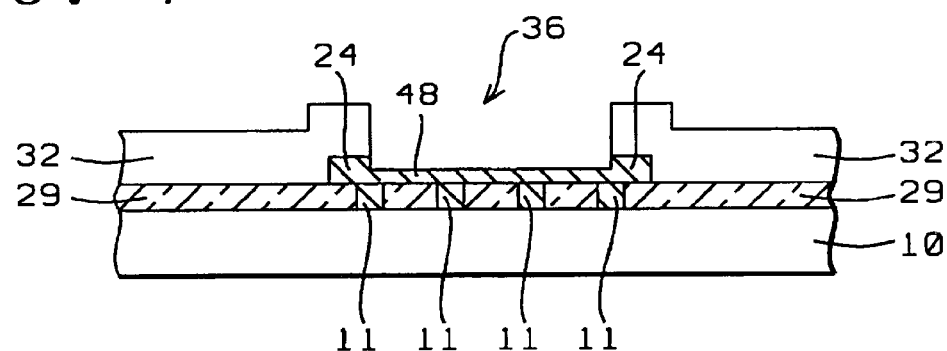

To summarize FIGS. 7 through 9b:

FIG. 7 shows a cross section where the contact pad has been partially etched, stopping the etch of the aluminum pad 24 at the point where about 2000 Angstrom of aluminum is left in place; the contact pad is contacted by means of interconnect metal (not shown) that is created in the plane of the contact pad FIG. 8 is identical to FIG. 7 except that for the case that is shown in FIG. 8 the contact pad is contacted by means of vias 11

Figure 9B:
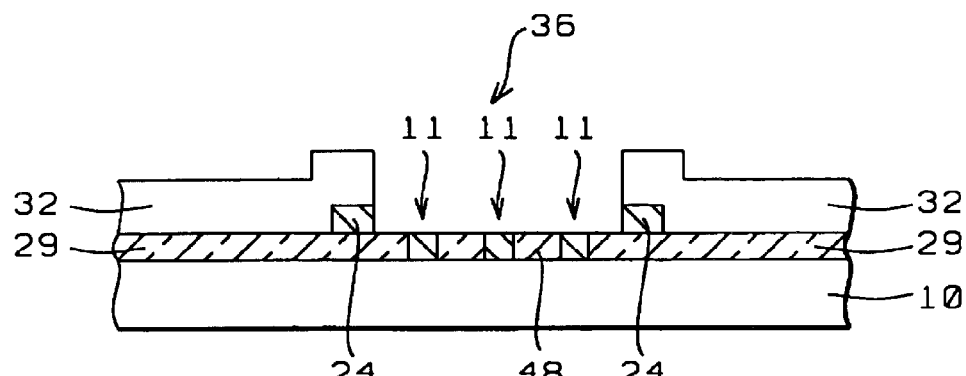
FIG. 9b shows a cross section after the contact pad has been completely etched using the layer of passivation as a self-aligned etching mask. The contact pad is contacted by means of an array of vias created in the underlying layer of dielectric, this array of vias is not part of the process of the invention.

FIG. 9a is identical with FIG. 7 except that the aluminum of the contact pad 24 has been completely removed from above the surface of layer 29 of dielectric in accordance with the opening 36 created in the layer 32 of passivation FIG. 9b is identical with FIG. 8 except that the aluminum of the contact pad 24 has been completely removed from above the surface of layer 29 of dielectric in accordance with the opening 36 created in the layer 32 of passivation.

Figure 10A:
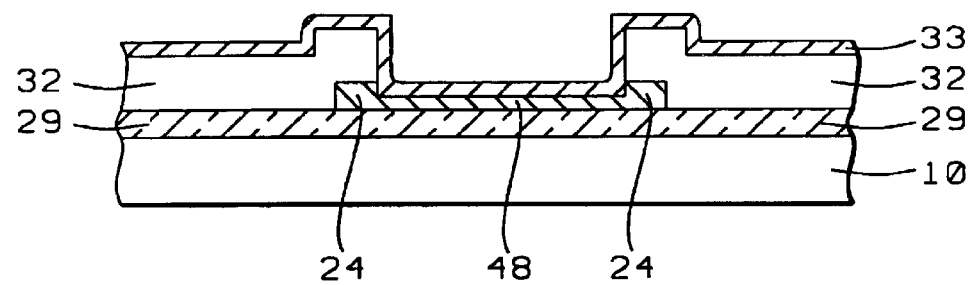
FIG. 10a shows a cross section after a layer of UBM has been formed overlying the partially etched contact pad and the layer of passivation of FIG. 7.

The processing of the cross section that is shown in FIGS. 7 through 9b continues as shown in cross section of FIG. 10a. FIG. 10a shows a cross section after the layer 33 of under bump metal (UBM) has been blanket deposited over the surface of the wafer. Layer 33 of UBM can be deposited by vacuum evaporation or by sputtering and may contain multiple layers of metal such as a layer of chrome, followed by a layer of copper. From the latter it is apparent that layer 33 of UBM may comprise several layers of metal that are successively deposited.

For a UBM layer that is blanket deposited over the surface of the wafer, including the exposed surface of the contact pad 24 and the exposed surface of layer 29 of dielectric (exposed in the opening 36), any of the conventional UBM materials can be used. A UBM layer can be deposited using a sputter chamber or an Ion Metal Plasma (IMP) chamber, deposited at a temperature of between about 0 and 300 degrees C., a pressure of between about 1 and 100 mTorr, using (for instance) copper or a copper alloy as the source (as highlighted above) at a flow rate of between about 10 and 400 sccm and using argon as an ambient gas.

It must be emphasized with respect to the cross section that is shown in FIG. 10a that layer 48 may have been completely removed by extended etching of the contact pad 24, as previously indicated. This layer 48 has been shown in FIG. 10a as being etched down to about 2000 Angstrom, if this layer has been completely removed from above the layer 29 of dielectric, the layer 33 of UBM is deposited directly on the surface of layer 29 of dielectric.

Figure 10B:
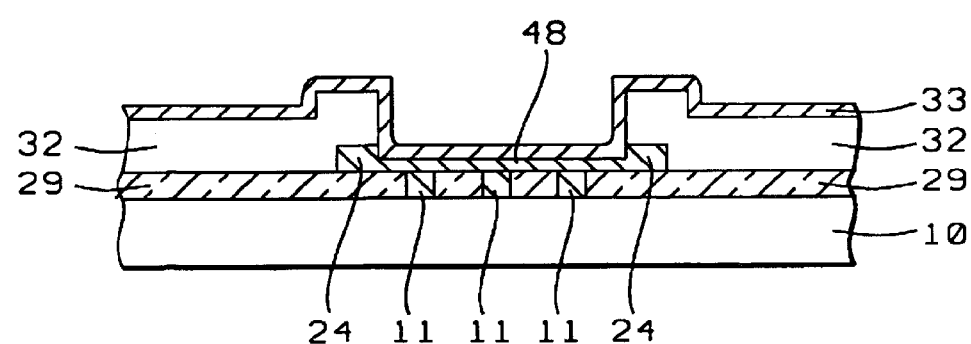
FIG. 10b shows a cross section after a layer of UBM has been formed overlying the partially etched contact pads and the layer of passivation. The contact pad is contacted by means of an array of vias created in the underlying layer of dielectric, this array of vias is not part of the process of the invention.

FIG. 10b shows a cross section after the layer 33 of under bump metal (UBM) has been deposited over the surface that is shown in cross section of FIG. 8, that is the embodiment of the invention where vias through the layer 29 of dielectric as used to make contact with contact pad 24.

Figure 11A:
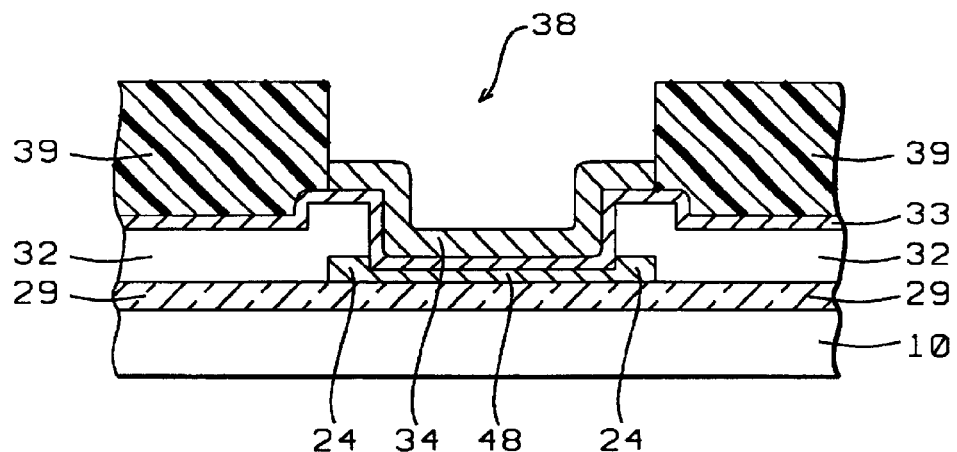
FIG. 11a shows a cross section after a layer of photoresist has been deposited, patterned and etched over the structure of FIG. 10a, creating an opening in the layer of photoresist that aligns with the contact pad. A layer of enhanced UBM has been deposited over the surface of the layer of UBM.

FIG. 11a is a continuation of FIG. 10a and shows how a layer 39 of photoresist has been deposited over the layer 33 of UBM. Layer 39 of photoresist is patterned and developed, creating an opening 38 in the layer 39 of photoresist that is slightly wider than the opening of the bonding pad of the to be created solder bump.

Next and also shown in cross section in FIG. 11a, a layer 34 of enhanced UBM, typically of copper or nickel and of a thickness between about 1 and 10 µm is electroplated over the layer 33 of UBM. The UBM layer 33 serves as the common electrode for the electroplating process with the layer of photoresist still being in place.

It must again be pointed out with respect to the cross section that is shown in FIG. 11a that layer 48, although this layer is shown in this cross section, may in fact have been removed completely from the surface of the dielectric layer 29.

Figure 11B:
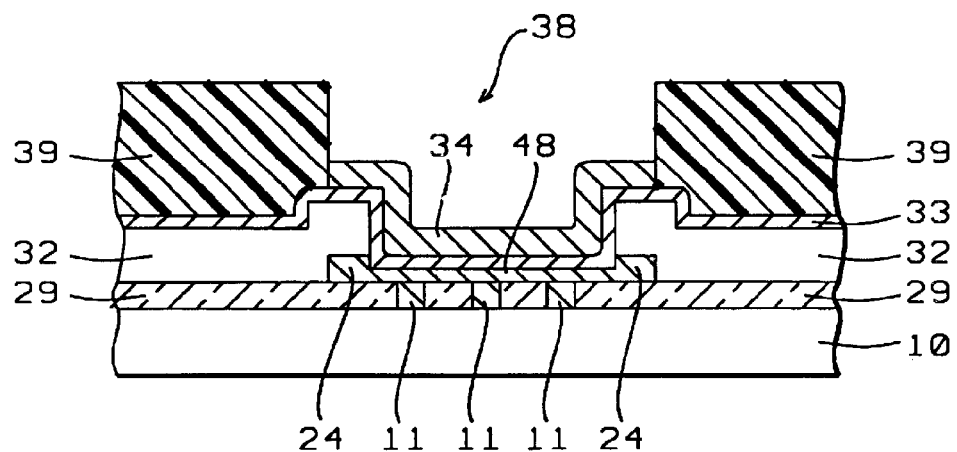
FIG. 11b shows a cross section after a layer of photoresist has been deposited, patterned and etched over the structure of FIG. 10b, creating an opening in the layer of photoresist that aligns with the contact pad. A layer of enhanced UBM has been deposited over the surface of the layer of UBM.

The cross section that is shown in FIG. 11b will be recognized as a continuation of the cross section shown in FIG. 10b. The cross section of FIG. 11b is created by applying processing steps (to the cross section of FIG. 10b) that are identical to the processing steps that have been applied to create FIG. 11a (from the cross section shown in FIG. 10a). Where therefore FIG. 11a is a continuation of FIG. 10a, FIG. 11b is a continuation of FIG. 10b. All the remarks that have been provided relating to FIG. 11a can also be made with respect to FIG. 11b, FIG. 11b is shown since the vias are present in this cross section.

Figure 12A:
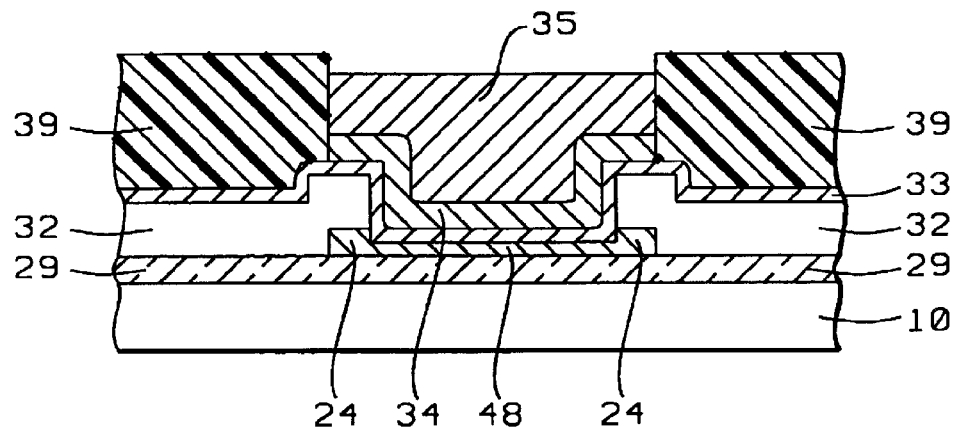
Figure 12B:
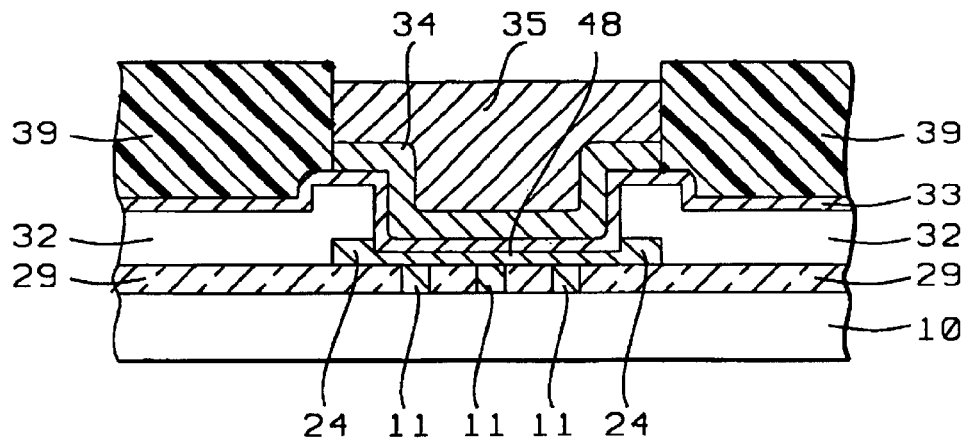
FIG. 12b shows a cross section after a layer of bump metal has been deposited over the layer of enhanced UBM of the structure of FIG. 11b.

Next the layer 35 of bump metal (typically solder or gold) is electroplated in contact with the layer 34 of enhanced UBM, this is shown in cross section in both FIG. 12a (for the case where the contact pad is accessed by interconnect metal created in the plane of the contact pad) and in FIG. 12b (for the case where vias 11 have been provided through the underlying layer of dielectric). It must again be pointed out, with respect to both FIG. 12a and FIG. 12b, that layer 48, although shown in cross section in these figures, may have been completely removed from the surface of layer 29 of dielectric.

The layer 35 of electroplated metal is centered in the opening 38 (FIGS. 12a and 12b) that has been created in the layer 39 of photoresist.

Figure 13A:
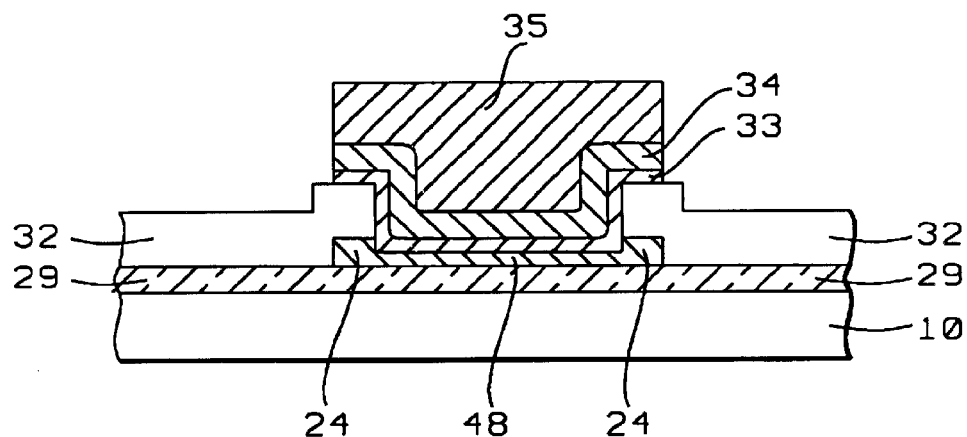
Figure 13B:
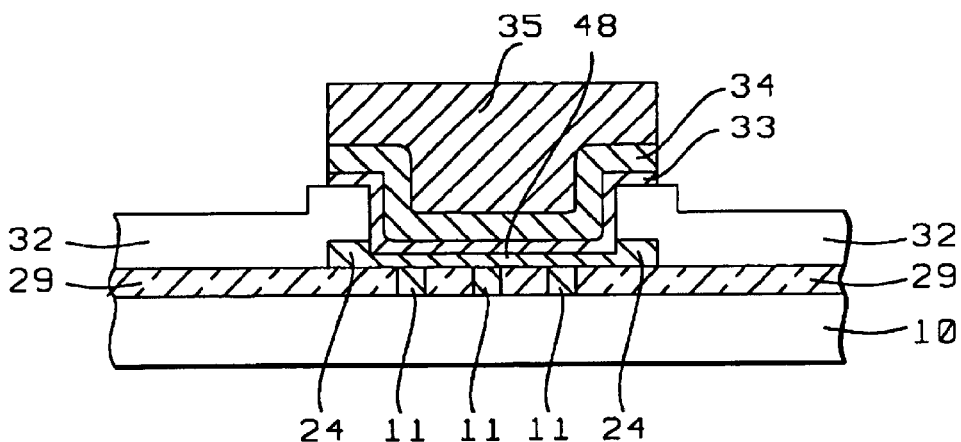

FIGS. 13a and 13b show a cross section after the layer 39 (FIGS. 12a and 12b) of photoresist has been removed. The layer 33 of UBM has been etched using the patterned layer 35 of electroplated metal as a mask.

Figure 14A:
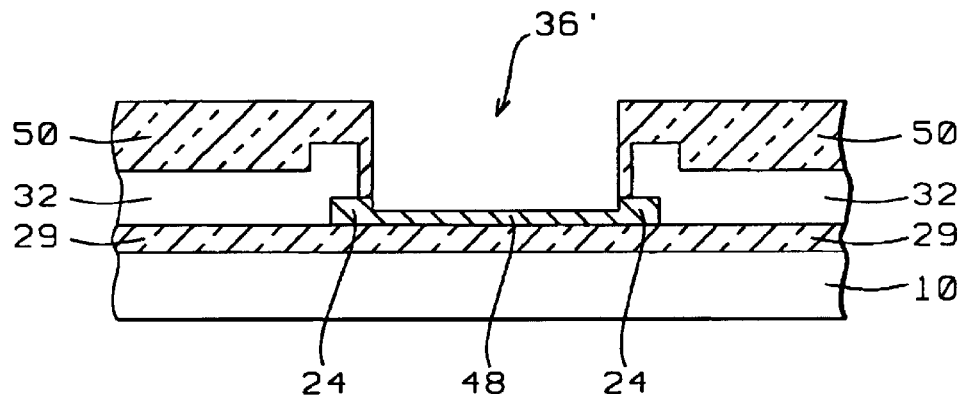
Figure 14B:
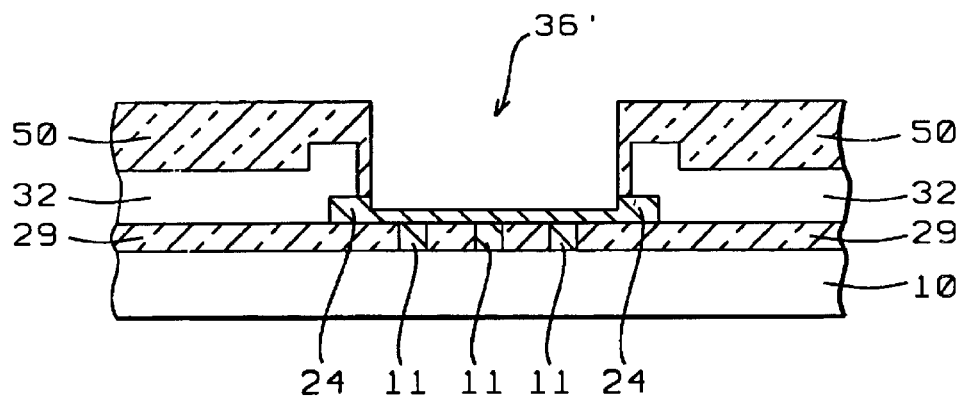
FIG. 14b can be compared with FIG. 8. A layer of polyimide has been added and patterned to the cross section that is shown in FIG. 14b. The contact pad is then either partially or completely etched in accordance with the opening created in the layer of polyimide.

The above summarized processing steps of electroplating that are used for the creation of a metal bump can be supplemented by the step of curing or pre-baking of the layers of photoresist after these layers have been deposited. The invention can also be applied to other processes that are used to create solder bumps such as screen printing and stencil printing.

Where FIGS. 6 through 13b have shown the metal bump of the invention that does not make use of a layer of polyimide, the following drawings address the metal bump of the invention that does make use of a layer of polyimide. These drawings start with FIG. 14a, it is assumed that prior to the cross section that is shown in FIG. 14a the processing sequence that has previously been discussed using FIGS. 6 through 9b has been performed. In comparing FIG. 7 with FIG. 14a and in comparing FIG. 8 with FIG. 14b, this latter statement can readily be accepted. The difference between FIG. 7 and FIG. 14a is that a layer 50 of polyimide has been deposited over the surface of the passivation layer 32. Layer 50 has been patterned and etched, using conventional methods, creating opening 36' in the layer of polyimide. What must be remarked in this respect is that the diameter of opening 36' can be slightly or even significantly smaller than the diameter of the opening 36 (FIG. 7) that has been created in the layer 32 of passivation. The opening 36' should cover the probe mark 28. The difference between FIG. 8 and FIG. 14b also results from the deposition of a layer of polyimide over the surface of the passivation layer 32 (FIG. 14b). Layer 50 (FIG. 14b) has been patterned and etched, using conventional methods, creating opening 36' in the layer of polyimide with a diameter of opening 36' that is slightly or significantly smaller than the diameter of the opening 36 (FIG. 8). The opening 36' should cover the probe mark 28.

Some comments are in order at this time relating to the use of the layer of polyimide. The layer of polyimide is very important because the polyimide covers fuses in order to prevent exposure of the fuses during subsequent etching of the damaged contact pads. The processing sequence for SRAM wafers can be summarized as follows:

- after SRAM wafers have been processed, a first chip probe test (CP1) is performed
- poorly performing memory bits are repaired by breaking the related fuse
- a second chip probe test (CP2) is performed
- the surface of the whole wafer is covered with a layer of polyimide
- the deposited layer of polyimide is patterned, creating openings to the contact pad, the aluminum pad is at this time partially or completely removed by etching
- after the previous step has been completed, regular solder bump processing resumes.

FIG. 14a can be compared with FIG. 7, a patterned layer 50 of polyimide has been added to the cross section that is shown in FIG. 14a.

FIG. 14b can be compared with FIG. 8, a patterned layer 50 of polyimide has been added to the cross section that is shown in FIG. 14b.

Figure 15A:
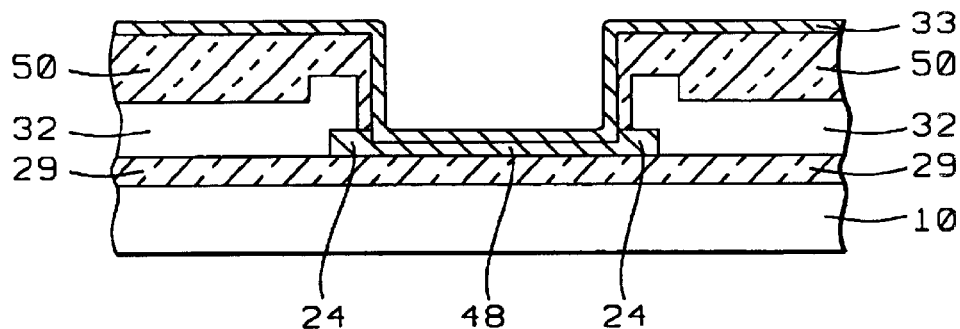

FIG. 15a can be compared with FIG. 10a, a patterned layer 50 of polyimide has been added to the cross section that is shown in FIG. 15a.

Figure 15B:
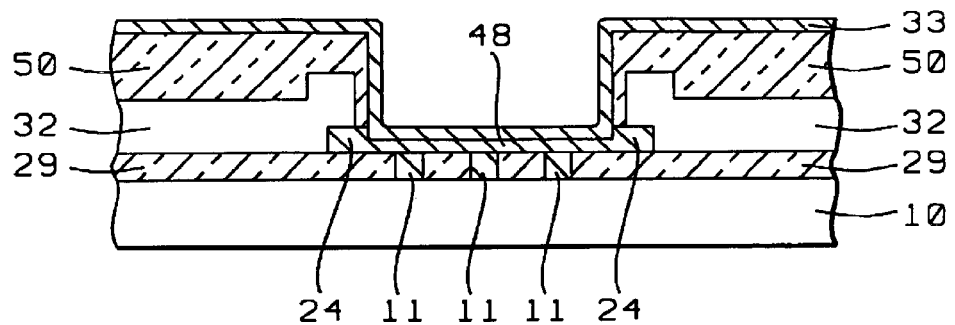
FIG. 15b can be compared with FIG. 10b, a patterned layer of polyimide has been added to the cross section that is shown in FIG. 15b.

FIG. 15b can be compared with FIG. 10b, a patterned layer 50 of polyimide has been added to the cross section that is shown in FIG. 15b.

Figure 16A:
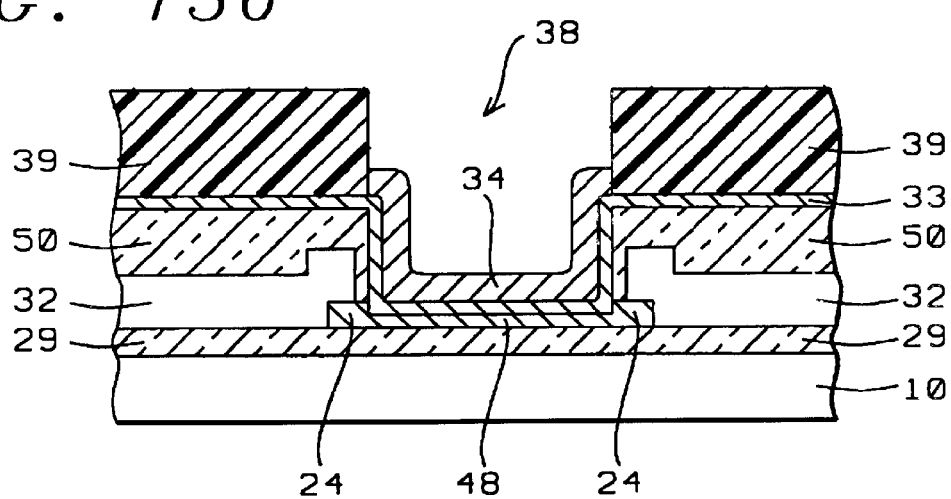

FIG. 16a can be compared with FIG. 11a, a patterned layer 50 of polyimide has been added to the cross section that is shown in FIG. 16a.

Figure 16B:
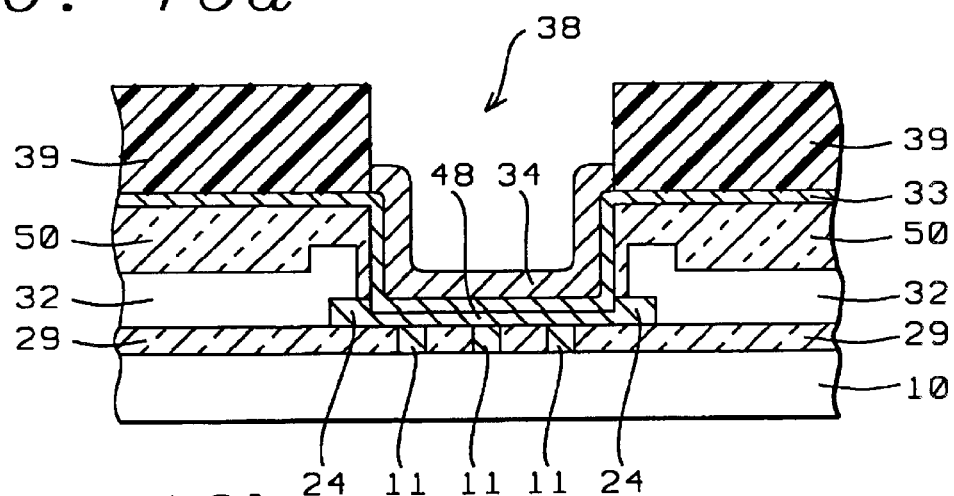
FIG. 16b can be compared with FIG. 11b, a patterned layer of polyimide has been added to the cross section that is shown in FIG. 16b.

FIG. 16b can be compared with FIG. 11b, a patterned layer 50 of polyimide has been added to the cross section that is shown in FIG. 16b.

Figure 17A:
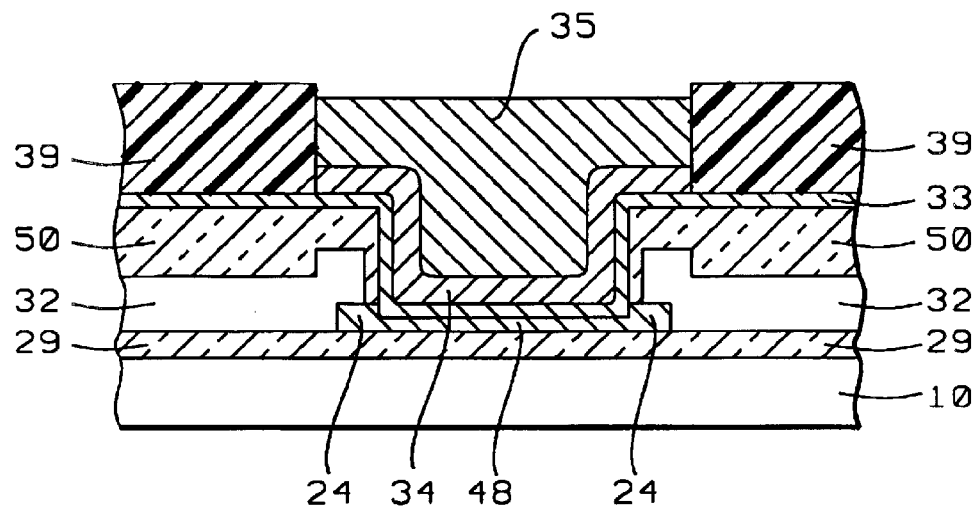

FIG. 17a can be compared with FIG. 12a, a patterned layer 50 of polyimide has been added to the cross section that is shown in FIG. 17a.

Figure 17B:
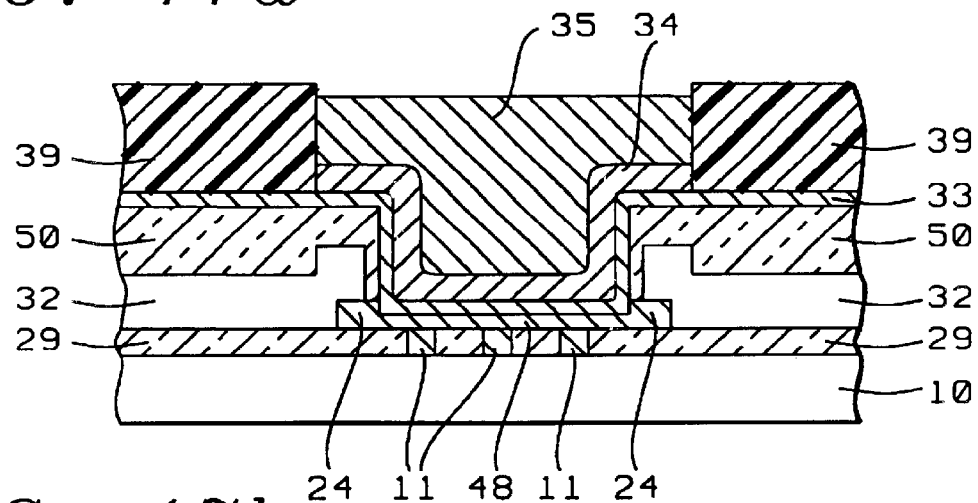
FIG. 17b can be compared with FIG. 12b, a patterned layer of polyimide has been added to the cross section that is shown in FIG. 17b.

FIG. 17b can be compared with FIG. 12b, a patterned layer 50 of polyimide has been added to the cross section that is shown in FIG. 17b.

Figure 18A:
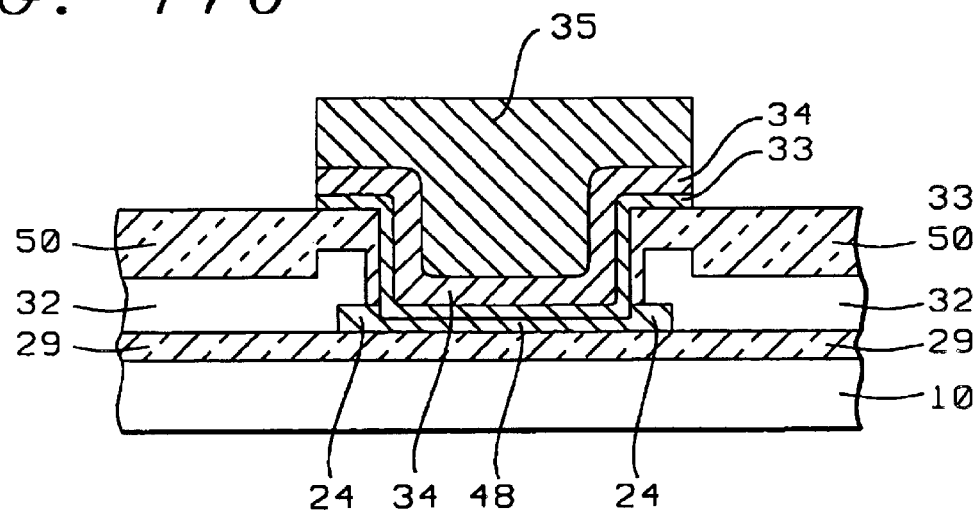

FIG. 18a can be compared with FIG. 13a, a patterned layer 50 of polyimide has been added to the cross section that is shown in FIG. 18a.

FIG. 18b can be compared with FIG. 13b, a patterned layer 50 of polyimide has been added to the cross section that is shown in FIG. 18b.

From the cross section that is shown in FIG. 18a, the cross section that is shown in FIG. 4b can be achieved by forming the metal bump 35 by reflowing the metal bump layer 35 that is shown in FIG. 18a.

From the cross section that is shown in FIG. 18b, the cross section that is shown in FIG. 5b can be achieved by forming the metal bump 35 by reflowing the metal bump layer 35 that is shown in FIG. 18b.

To review and summarize the invention:

- the invention starts with a semiconductor surface, a layer of dielectric has been deposited over the semiconductor surface, a contact pad has been provided on the layer of dielectric, the contact pad has served as an Input/Output (I/O) point of contact during semiconductor device testing, the contact pad is assumed to be connected to at least one point of electrical contact provided in or on the surface of the substrate, the at least one point of electrical contact is assumed to be connected to at least one semiconductor device having been provided in or on the surface of the substrate, the contact pad having an exposed surface
- a layer of passivation is deposited over a semiconductor surface including the surface of said contact pad
- the layer of passivation is patterned and etched, creating an opening in the layer of passivation having a first diameter, partially exposing the surface of the contact pad over a surface area of the first diameter, the opening in the layer of passivation being centered with respect to the contact pad
- the contact pad is completely or partially etched in accordance with the opening created in the passivation layer, either leaving a thin layer of aluminum in place or partially exposing the surface of the layer of dielectric deposited over the surface of the substrate
- an in-situ sputter clean is performed of the exposed surface of the contact pad
- a layer of Under Bump Metallurgy (UBM) is sputtered over the surface of the layer of passivation, including the exposed surfaces of the contact pad
- a layer of photoresist is deposited over the semiconductor surface of the layer of UBM
- the layer of photoresist is patterned and etched, creating an opening in the layer of photoresist that is aligned with the contact pad, partially exposing the surface of the layer of UBM
- the exposed surface of the layer of UBM is electroplated with a layer of enhanced UBM
- the layer of enhanced UBM is electroplated with a thick layer of bump metal, partially filling the opening created in the layer of photoresist
- the patterned and etched layer of photoresist is removed from above the semiconductor surface
- the layer of UBM is etched using the deposited layer of bump metal as a mask, and
- the surface of said layer of bump metal is reflowed, forming the metal bump.

In addition, a layer of polyimide may be deposited over the layer of passivation, patterned and etched, creating an opening in the layer of polyimide that has a diameter which is slightly or significantly smaller than the diameter of the opening created in the layer of passivation. The created opening is larger than the size of the probe mark. Processing, after the opening has been created in the layer of polyimide, is the same as the processing that is performed (without the layer of polyimide) after an opening has been created in the layer of passivation.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming a metal bump on a semiconductor substrate, comprising the steps of:

providing a semiconductor substrate, said semiconductor substrate having been provided in or on the surface thereof with a contact pad, said contact pad sitting on an underlying layer of dielectric and being in electrical contact with at least one point of electrical contact in or on the surface of said substrate;

depositing a layer of passivation over the surface of said layer of dielectric underlying the contact pad, including the surface of said contact pad;

patterning and etching said layer of passivation, creating an opening in said layer of passivation having a first diameter, partially exposing the surface of said contact pad over a surface area of said first diameter, said first diameter of said opening created in said layer of passivation being smaller than a surface area of said contact pad by an amount;

etching said contact pad, using said layer of passivation as a mask, partially or completely first removing said contact pad from above the surface of said layer of dielectric, creating a opening in said contact pad having a diameter being about equal to said first diameter;

sputtering a layer of Under Bump Metallurgy (UBM) over the surface of said layer of passivation, including said opening created in said contact pad;

depositing and patterning a layer of photoresist, creating an opening in the photoresist with a slightly larger dimension than said first diameter;

electroplating a layer of bump metal in the photoresist opening; stripping the layer of photoresist and etching said layer of UBM, using said layer of bump metal as a mask; and reflowing the surface of said layer of bump metal, forming the metal bump.

2. The method of claim 1 wherein said opening created in said contact pad has a depth that is less than a height of said contact pad by an amount.

3. The method of claim 1 wherein said opening created in said contact pad has a depth that is equal to a height of said contact pad.

4. The method of claim 1 wherein said contact pad comprises aluminum or copper or a compound thereof.

5. The method of claim 1 further comprising the additional step of electroplating an enhanced UBM layer, after creating said opening in said layer of. photoresist, and prior to electroplating said layer of bump metal.

6. The method of claim 1 wherein said contact pad is accessed by means of interconnect metal being provided in a plane of said contact pad and overlying said layer of dielectric.

7. The method of claim 1 wherein said contact pad is accessed by means of at least one via provided through said layer of dielectric.

8. A method for forming a metal bump on a semiconductor substrate, comprising the steps of:

providing a semiconductor substrate, said semiconductor substrate having been provided in or on the surface thereof with a contact pad, said contact pad sitting on an underlying layer of dielectric;

depositing a layer of passivation over the surface of said layer of dielectric, including the surface of said contact pad;

patterning and etching said layer of passivation, creating an opening in said layer of passivation having a first diameter, partially exposing the surface of said contact pad over a surface area of said first diameter, said first diameter of said opening created in said layer of passivation being smaller than a surface area of said contact pad by an amount;

depositing a layer of polyimide over the surface of said layer of passivation, including the opening created in said layer of passivation;

patterning and etching said layer of polyimide, creating an opening in said layer of polyimide having a second diameter, partially exposing the surface of said contact pad over a surface area of said second diameter, said second diameter of said opening created in said layer of polyimide being smaller than said first diameter by an amount;

etching said contact pad, using said layer of polyimide as a mask, partially or completely removing said contact pad from above the surface of said layer of dielectric, creating an opening in said contact pad having a diameter being about equal to said second diameter;

sputtering a layer of Under Bump Metallurgy (UBM) over the surface of said layer of polyimide, including said opening created in said contact pad;

depositing and patterning a layer of photoresist, creating an opening in said layer of photoresist with a slightly larger dimension than said second diameter;

electroplating a layer of bump metal in the opening created in said layer of photoresist;

stripping said layer of photoresist;

etching said layer of UBM, using said layer of bump metal as a mask; and reflowing the surface of said layer of bump metal, forming the metal bump.

9. The method of claim 8 wherein said opening created in said contact pad has a depth that is less than a height of said contact pad by an amount.

10. The method of claim 8 wherein said opening created in said contact pad has a depth that is equal to a height of said contact pad.

11. The method of claim 8 wherein said contact pad comprises aluminum or copper or a compound thereof.

12. The method of claim 8 further comprising the additional step of electroplating an enhanced UBM layer, after creating said opening in said layer of photoresist, and prior to electroplating said layer of bump metal.

13. The method of claim 8 wherein said contact pad is accessed by means of interconnect metal being provided in a plane of said contact pad and overlying said layer of dielectric.

14. The method of claim 8 wherein said contact pad is accessed by means of at least one via provided through said layer of dielectric down to the surface of said semiconductor surface.

15. A method for forming a metal bump on a semiconductor substrate, comprising the steps of:

providing a semiconductor substrate, said semiconductor substrate having been provided on the surface thereof with a contact pad, said contact pad overlying a layer of dielectric, said layer of dielectric having been deposited over said semiconductor substrate; and partially removing said contact pad in accordance with a mask of passivation material, said removing having a removal thickness and removal surface area wherein said mask is not removed during further processing.

16. The method of claim 15 wherein said removal surface area of said contact pad is smaller than a surface area of said contact pad by an amount.

17. The method of claim 15 wherein said removal thickness of said contact pad is less than a height of said contact pad by an amount.

18. The method of claim 15 wherein said removal thickness of said contact pad equals a height of said contact pad.

19. The method of claim 15 wherein said partially removing said contact pad in accordance with a mask of passivation material comprises the steps of:

depositing a layer of passivation material over the surface of said layer of dielectric, including the surface of said contact pad;

patterning and etching said layer of passivation material, creating an opening in said layer of passivation material having a first diameter, partially exposing the surface of said contact pad over a surface area of said first diameter, said first diameter of said opening created in said layer of passivation material being smaller than a surface area of said contact pad by an amount; and etching said contact pad, using said patterned layer of passivation material as a mask, creating an opening in said contact pad having a second diameter, partially or completely first removing said contact pad front above the surface of said layer of dielectric, said second diameter of said first opening created in said contact pad being about equal to said first diameter of said opening created in said layer of passivation material.

20. The method of claim 19 with additional steps of:

sputtering a layer of Under Bump Metallurgy (UBM) over the surface of said layer of passivation, including said first opening created in said contact pad, leaving in place a layer of said UBM overlying said contact pad;

depositing and patterning a layer of photoresist, creating an opening in said layer of photoresist with a slightly larger diameter than said first diameter; electroplating a layer of bump metal in said opening created. in said layer of photoresist;

stripping the layer of photoresist and blanket etching said layer of UBM; and reflowing the surface of said layer of bump metal, forming the metal bump.

21. The method of claim 20 wherein said layer of Under Bump Metallurgy comprises a plurality of sub-layers of different metallic composition.

22. The method of claim 15 wherein said contact pad comprises aluminum or copper or a compound thereof.

23. The method of claim 20 with the additional step of electroplating an enhanced layer of UBM, after creating the opening in said layer of photoresist, and prior to the electroplating of said layer of bump metal.

24. The method of claim 15 wherein said contact pad is accessed by means of interconnect metal being provided in a plane of said contact pad and overlying said layer of dielectric.

25. The method of claim 15 wherein said contact pad is accessed by means of at least one via provided through said layer of dielectric.

26. The method of claim 15 wherein said partially removing said contact pad comprises the steps of:

depositing a layer of passivation over the surface of said layer of dielectric, including the surface of said contact pad;

patterning and etching said layer of passivation, creating an opening in said layer of passivation having a first diameter, partially exposing the surface of said contact pad over a surface area of said first diameter, said first diameter of said opening created in said layer of passivation being smaller than a surface area of said contact pad by an amount;

depositing a layer of polyimide over the surface of said layer of passivation, including the opening created in said layer of passivation;

patterning and etching said layer of polyimide, creating an opening in said layer of polyimide having a second diameter, partially exposing the surface of said contact pad over a surface area of said second diameter, said second diameter of said opening created in said layer of polyimide being smaller than said first diameter by an amount; and etching said contact pad, using said layer of polyimide as a mask, partially or completely removing said contact pad from above the surface of said layer of dielectric, creating an opening in said contact pad having a diameter being about equal to said second diameter.

27. The method of claim 26 with additional steps of:

sputtering a layer of Under Bump Metallurgy (UBM) over the surface of said layer of polyimide, including said opening created in said contact pad;

depositing and patterning a layer of photoresist, creating an opening in said layer of photoresist with a slightly larger dimension than said second diameter;

electroplating a layer of bump metal in the opening created in said layer of photoresist;

stripping said layer of photoresist;

etching said layer of UBM, using said layer of bump metal as a mask; and reflowing the surface of said layer of bump metal, 1 forming the metal bump.

28. The method of claim 27 with the additional steps of electroplating an enhanced layer of UBM, after creating the opening in said second layer of photoresist, and prior to the electroplating of said layer of bump metal.

* * * * *